(12) United States Patent
Abdou Ahmen et al.

(10) Patent No.: US 8,687,667 B2
(45) Date of Patent: Apr. 1, 2014

(54) LASER SYSTEM

(71) Applicant: Universitaet Stuttgart Institut fuer Strahlwerkzeuge, Stuttgart (DE)

(72) Inventors: Marwan Abdou Ahmen, Stuttgart (DE); Andreas Voss, Stuttgart (DE)

(73) Assignee: Universitaet Stuttgart Institut fuer Strahlwerkzeuge, Stuttgart (DE)

( * ) Notice: Subject to any disclaimer, the term of this patent is extended or adjusted under 35 U.S.C. 154(b) by 0 days.

(21) Appl. No.: 13/624,129

(22) Filed: Sep. 21, 2012

(65) Prior Publication Data
US 2013/0182732 A1 Jul. 18, 2013

Related U.S. Application Data

(63) Continuation of application No. PCT/EP2011/054377, filed on Mar. 22, 2011.

(30) Foreign Application Priority Data

Mar. 24, 2010 (DE) .......................... 10 2010 003 227

(51) Int. Cl.
*H01S 3/08* (2006.01)
(52) U.S. Cl.
USPC ............... 372/102; 372/101; 372/98; 372/32; 372/20
(58) Field of Classification Search
USPC ................................. 372/102, 101, 98, 32, 20
See application file for complete search history.

(56) References Cited

U.S. PATENT DOCUMENTS

| | | | |
|---|---|---|---|
| 4,245,195 | A | 1/1981 | Fahlen et al. |
| 4,638,486 | A | 1/1987 | Dost et al. |
| 4,719,635 | A | 1/1988 | Yeh |
| 4,815,094 | A | 3/1989 | Cantoni |
| 5,131,002 | A | 7/1992 | Mooradian |
| 5,148,441 | A | 9/1992 | Itai |
| 5,329,539 | A | 7/1994 | Pearson et al. |

(Continued)

FOREIGN PATENT DOCUMENTS

| | | |
|---|---|---|
| DE | 40 08 225 | 9/1991 |
| DE | 195 12 427 | 10/1996 |

(Continued)

OTHER PUBLICATIONS

B. L. Volodin et al., "Wavelength stabilization and spectrum narrowing of high-power multimode laser diodes and arrays by use of volume Bragg gratings", Optics Letters, Aug. 15, 2004, vol. 29, No. 16, pp. 1891-1893.

(Continued)

*Primary Examiner* — Kinam Park
(74) *Attorney, Agent, or Firm* — Lipsitz & McAllister, LLC

(57) ABSTRACT

To improve a laser system comprising at least one externally stabilizable semiconductor laser, from the laser active zone of which a laser radiation field can be coupled out, and a feedback element, disposed externally in the laser radiation field, which couples out, from the laser radiation field, a feedback radiation field having a defined wavelength and bandwidth, and couples back same into the active laser zone for determining the wavelength and bandwidth of the laser radiation field, in such a way that the wavelength stabilization may be achieved more cost-effectively, it is proposed that the feedback element is a resonant waveguide grating which reflects back a portion of the laser radiation field lying within an angular acceptance range.

20 Claims, 24 Drawing Sheets

(56) References Cited

U.S. PATENT DOCUMENTS

| | | |
|---|---|---|
| 5,373,627 A | 12/1994 | Grebe |
| 5,455,838 A | 10/1995 | Heritier et al. |
| 5,663,979 A | 9/1997 | Marshall |
| 5,665,473 A | 9/1997 | Okoshi et al. |
| 5,683,942 A | 11/1997 | Kata et al. |
| 5,684,900 A * | 11/1997 | Nishiwaki et al. ............. 385/31 |
| 5,715,263 A | 2/1998 | Ventrudo et al. |
| 5,729,561 A | 3/1998 | Hironaka |
| 5,766,277 A | 6/1998 | DeVoe et al. |
| 5,844,309 A | 12/1998 | Takigawa et al. |
| 5,910,522 A | 6/1999 | Schmidt et al. |
| 5,949,805 A | 9/1999 | Mordaunt et al. |
| 6,101,201 A | 8/2000 | Hargis et al. |
| 6,118,804 A | 9/2000 | Altmann et al. |
| 6,195,372 B1 | 2/2001 | Brown |
| 6,285,703 B1 | 9/2001 | Schlüter |
| 6,347,109 B1 | 2/2002 | Beach et al. |
| 6,385,220 B1 | 5/2002 | Miller et al. |
| 6,393,038 B1 | 5/2002 | Raymond et al. |
| 6,438,152 B2 | 8/2002 | Contag et al. |
| 6,577,666 B2 | 6/2003 | Erhard et al. |
| 6,747,789 B2 | 6/2004 | Huonker et al. |
| 6,804,274 B2 | 10/2004 | Huonker et al. |
| 6,963,592 B2 | 11/2005 | Huonker et al. |
| 8,264,765 B2 | 9/2012 | Vallius et al. |
| 2001/0038658 A1 | 11/2001 | Contag et al. |
| 2001/0040909 A1 | 11/2001 | Erhard et al. |
| 2003/0133485 A1 * | 7/2003 | Liu ................................ 372/50 |
| 2006/0256830 A1 * | 11/2006 | Volodin et al. ................. 372/102 |
| 2008/0304535 A1 | 12/2008 | Parriaux et al. |
| 2011/0051226 A1 * | 3/2011 | Vallius et al. .................. 359/326 |

FOREIGN PATENT DOCUMENTS

| | | |
|---|---|---|
| DE | 195 41 020 | 5/1997 |
| DE | 197 28 845 | 1/1999 |
| EP | 0 632 551 | 1/1995 |
| EP | 0 709 938 | 5/1996 |
| EP | 0 903 819 | 3/1999 |
| EP | 2 290 765 | 3/2011 |
| WO | WO 02/101895 | 12/2002 |

OTHER PUBLICATIONS

Nabors, C.D., et al., "High-power, continuous-wave, Nd:YAG microchip laser array", Optics letters, vol. 17, No. 22, Nov. 5, 1992, pp. 1587-1589.

Patent Abstracts of Japan, Abstract of Japanese Publication No. 07-079038, "LD Excited Solid-State Laser Device", Publication date Mar. 20, 1995.

Giesen, A., et al., "Scalable Concept for Diode-Pumped High-Power Solid-State Lasers", Applied Physics B: Lasers and Optics, Appl. Phys. B 58 (1994), pp. 365-372.

Brauch, U., et al., "Multiwatt diode-pumped Yb:YAG thin disk laser continuously tunable between 1018 and 1053 nm", Apr. 1, 1995, vol. 20, No. 7, Optical Letters, pp. 713-715, Optical Society of America.

A. Avrutskii, et al., "Spectral and laser characteristics of a mirror with a corrugated waveguide on its surface". American Institute of Physics, Sov. J. Quantum Electron. 16(8), Aug. 1986, pp. 1063-1065.

* cited by examiner

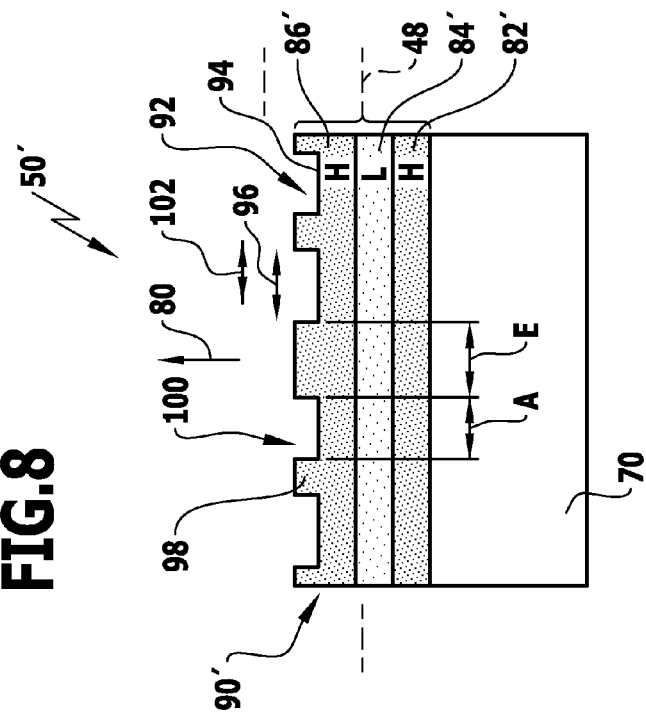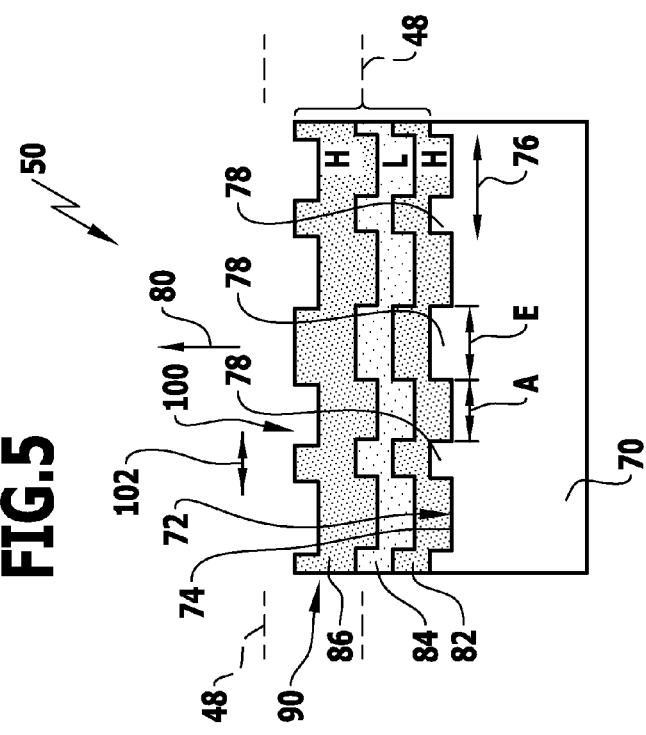

LASER SYSTEM

This application is a continuation of International application No. PCT/EP2011/054377 filed on Mar. 22, 2011 and claims the benefit of German application number 10 2010 003 227.1 filed on Mar. 24, 2010, the teachings and disclosure of which are hereby incorporated in their entirety by reference thereto.

BACKGROUND OF THE INVENTION

The invention relates to a laser system comprising at least one externally stabilizable semiconductor laser, from the laser active zone of which a laser radiation field can be coupled out, and a feedback element, disposed externally in the laser radiation field, which couples out, from the laser radiation field, a feedback radiation field having a defined wavelength and bandwidth, and couples back the same into the active laser zone for determining the wavelength and bandwidth of the laser radiation field.

These types of laser systems are known from B. L. Voladin et al., Optics Letters, Aug. 15, 2004, Vol. 29, No. 16, pp. 1891-1893. The volume Bragg grating used therein is very expensive due to the specialized materials used.

SUMMARY OF THE INVENTION

It is an object of the invention, therefore, to improve a laser system of the generic kind in such a way that the wavelength stabilization may be achieved more cost-effectively.

For a laser system of the type described at the outset, this object is achieved according to the invention in that the feedback element is a resonant waveguide grating which reflects back a portion of the laser radiation field lying within an angular acceptance range.

The advantage of this type of resonant waveguide grating is that, due to the fact that it reflects resonantly, it is very narrowband and in particular may be implemented very cost-effectively, and thus represents an ideal option for determining the wavelength of the laser radiation field.

In the context of the solution according to the invention, externally stabilizable semiconductor lasers have a back-reflection of less than 30% at the exit side. Semiconductor lasers having a back-reflection of less than 10%, preferably less than 1%, at the exit side, are externally stabilizable in a particularly advantageous manner.

It is particularly advantageous if the feedback element is a resonant waveguide grating having multiple periodicity, i.e., a resonant waveguide grating whose structures have a multiple periodicity instead of a single periodicity, since the angular acceptance range is enlarged for this type of waveguide grating by suitable design.

It is particularly advantageous if the resonant waveguide grating has an angular acceptance range of greater than ±1°, and it is even more advantageous if the resonant waveguide grating has an angular acceptance range of greater than ±2°.

Furthermore, it is preferably provided that the resonant back-reflection of the waveguide grating is polarization-dependent, i.e., only one polarization direction is resonantly reflected back, and the polarization direction oriented perpendicularly thereto passes through the resonant waveguide grating during transmission.

The resonant waveguide grating is preferably formed in such a way that it has a resonant back-reflection direction which extends parallel to the direction of incidence of the laser radiation field, but in the opposite direction to same.

Moreover, it is preferably provided that the resonant waveguide grating operates in a substantially absorption-free manner in the resonance wavelength range.

Operation in a substantially absorption-free manner is understood to mean that less than 5%, preferably less than 1%, and particularly preferably less than 0.5%, of the incident intensity is absorbed.

The exemplary embodiments mentioned before have provided no further detailed information concerning the structure of the resonant waveguide grating.

An advantageous implementation form provides that the resonant waveguide grating has waveguide layers applied to a substrate.

This type of substrate may be made of quartz glass, crystalline quartz, YAG, sapphire, or diamond, for example.

With regard to the plurality of waveguide layers, the manner in which the grating structure is to be specified has not been defined previously in greater detail.

One approach provides that a grating structure is specified by a substrate surface which carries the waveguide layers.

To this end, another alternative approach provides that the grating structure is specified by a topmost waveguide layer facing away from the substrate.

The number of waveguide layers in conjunction with the above-described exemplary embodiments has not been specified previously in greater detail.

An advantageous approach provides that the resonant waveguide grating is composed of at least three waveguide layers: a topmost waveguide layer having a high index of refraction, a waveguide layer therebeneath having a lower index of refraction, and a waveguide layer, situated opposite from the topmost waveguide layer, having a high index of refraction.

The waveguide layers with a high index of refraction have an index of refraction in the range from 1.7 to 3.5.

The waveguide layer with a low index of refraction has an index of refraction in the range from 1.3 to 1.6.

In particular, it is provided that the difference in the indices of refraction between the waveguide layer having a high index of refraction and the waveguide layer having a low index of refraction is at least 0.2.

The indices of refraction of the topmost waveguide layer and of the waveguide layer situated opposite from the topmost waveguide layer are preferably approximately identical, in particular identical.

Furthermore, no information has been provided concerning the configuration of the waveguide layers in conjunction with the explanation previously of the resonant waveguide grating.

An advantageous approach provides that the waveguide layers of the resonant waveguide grating extend in planes which run parallel to a transverse plane extending transversely with respect to the direction of incidence of the laser radiation field.

It is preferably provided that the waveguide layers of the waveguide grating extend in planes which are oriented parallel to a transverse plane extending perpendicularly with respect to the direction of incidence.

In particular, it is provided that the resonant waveguide grating extends, on a side facing the incident laser radiation, transversely with respect to a direction of incidence, preferably perpendicularly with respect to the direction of incidence.

Previously, no further detailed information has been provided concerning the properties of the resonant waveguide grating, aside from the reflection thereof.

An advantageous embodiment of a resonant waveguide grating provides that the resonant waveguide grating partially back-reflects an incident laser radiation field, offset in a wavelength propagation direction.

Such a wavelength propagation direction is in particular the row direction in which elevations of the resonant waveguide grating are situated one after the other, the elevations in particular extending transversely with respect to the row direction.

It is preferably provided that the resonant waveguide grating has a wavelength propagation direction which extends parallel to a strip direction in which the resonant waveguide grating extends.

Previously, no further detailed information has been provided concerning a support for the resonant waveguide grating.

An advantageous approach provides that the resonant waveguide grating is situated on a substrate that is substantially transparent to the laser radiation field.

In principle, the substrate for the waveguide grating may be any desired substrate.

It is preferably provided that the resonant waveguide grating is coolable in order to avoid undesired heating of the resonant waveguide grating.

It has proven to be particularly advantageous for the resonant waveguide grating to be situated on a heat sink that is transparent to the laser radiation field.

This type of transparent heat sink may, for example, be a support for the substrate, or also a support for the resonant waveguide grating itself.

Alternatively, it is likewise advantageous if the transparent heat sink is made of one or more of materials such as crystalline quartz, YAG, sapphire, and diamond.

No information has been provided concerning the arrangement of the resonant waveguide grating in conjunction with the explanation previously of the individual embodiments.

For example, it would be conceivable to locate the resonant waveguide grating in a divergent region of the laser radiation field.

In this case, however, due to the limited angular acceptance range in the divergent region, only an arrangement of the resonant waveguide grating at a very small distance from an aperture of the semiconductor laser would be meaningful.

For this reason, it is preferably provided that the resonant waveguide grating is situated in an at least partially collimated region of the laser radiation field, so that when the waveguide is correctly oriented, the position of the resonant waveguide grating relative to the laser radiation field does not have a dominant influence on the functioning of the laser system.

Alternatively, however, it is also conceivable for the resonant waveguide grating to be situated in a focused portion of the laser radiation field with correct imaging, so that the arrangement of the resonant waveguide grating is less sensitive to the angle.

Furthermore, from a purely theoretical standpoint, the resonant waveguide grating could extend over the entire radiation cross-section of the laser radiation field, in which case the intensity reflected back in the feedback radiation field must be limited by suitable selection of the polarization, or suitable divergence or convergence of the laser radiation field.

For this reason, a particularly advantageous exemplary embodiment of a laser system according to the invention provides that the resonant waveguide grating is situated in a subarea of the radiation cross-section of the laser radiation field, so that by limiting the subarea of the radiation cross-section, it is possible to limit the intensity of the feedback radiation field.

Previously, no further detailed information has been provided concerning the configuration of the resonant waveguide grating in the radiation cross-section.

An advantageous approach provides that the resonant waveguide grating extends in a strip-like manner in a radiation cross-section of the laser radiation field.

In this regard, the resonant waveguide grating could be situated completely within the radiation cross-section.

A particularly advantageous approach which in particular allows the coupling of a plurality of laser radiation fields, and thus, also of a plurality of semiconductor lasers, provides that the resonant waveguide grating extends in a strip-like manner within at least two adjacently situated radiation cross-sections of adjacently situated laser radiation fields.

As an alternative to providing a continuous waveguide grating, preferably in the form of a strip or some other shape within the radiation cross-section, another advantageous approach provides that the resonant waveguide grating has grating patches distributed within the particular radiation cross-section.

These types of grating patches are preferably noncontiguous individual waveguide grating parts, situated at various locations in the radiation cross-section, whose overall action creates the feedback radiation field, so that the exiting radiation field has a plurality of areas that are radiation-free, but have smaller surface areas, which are then negligible in the far field.

These types of grating patches may, for example, be statistically distributed over the radiation cross-section.

However, one practical approach provides that the grating patches are situated in row directions extending at a spacing from one another, so that the grating patches are present at defined locations within the radiation cross-section.

The grating patches may be statistically arranged. Another approach provides for a periodic arrangement of the grating patches.

Previously, no further detailed information has likewise been provided concerning the arrangement of the semiconductor lasers.

An advantageous embodiment provides that the laser system has a plurality of externally stabilizable semiconductor lasers situated one after the other in a row direction in a semiconductor laser bar.

These types of semiconductor lasers are preferably arranged in such a way that the laser radiation fields have low divergence (slow axis) in a first direction parallel to the row direction.

In addition, the semiconductor lasers are preferably arranged in the semiconductor laser bar in such a way that the laser radiation fields have high divergence (fast axis) in a second direction extending transversely with respect to the row direction.

For these types of semiconductor laser bars, it is preferably provided that the semiconductor lasers situated one after the other in the row direction generate laser radiation fields which have radiation cross-sections situated one after the other in a direction extending parallel to the row direction.

In addition, if coupling of the laser radiation fields is to take place, it is advantageously provided that the strip-shaped resonant waveguide grating extends parallel to the row direction within at least two radiation cross-sections, so that the semiconductor lasers can be coupled with one another.

The strip-shaped resonant waveguide grating could extend only from an edge region of one radiation cross-section to the edge region of the other radiation cross-section, or in an overlapping area of the radiation cross-sections.

However, it is also conceivable for the strip-shaped waveguide grating to extend over more than one-half of each of the at least two radiation cross-sections.

A particularly preferred approach provides that the resonant waveguide grating forms a strip that extends through all laser radiation fields of the semiconductor laser bar in the direction parallel to the row direction.

When semiconductor lasers which are situated in semiconductor laser bars are provided, in order to increase the number of semiconductor lasers by a multiple, it is preferably provided that the semiconductor laser bars are arranged stacked one on top of the other in a stacking direction, so that apertures in the semiconductor lasers are situated in a two-dimensional surface.

Thus, even more semiconductor lasers are available, so that the available power may be increased.

Previously, no further detailed information has been provided concerning the production of the semiconductor lasers.

An advantageous approach provides that the semiconductor lasers are made of the same material in each of the semiconductor laser bars.

Such an approach opens up the possibility of producing the semiconductor lasers from the same material, within the semiconductor laser bar.

If all semiconductor lasers are to operate in the same wavelength range, all semiconductor laser bars may also be made of the same material.

Alternatively, however, it is possible for the semiconductor lasers to be made of different materials in different semiconductor laser bars, so that, for example, based on the type of material used for the production, the wavelength range in which the semiconductor lasers are stabilizable may also be varied.

Numerous approaches are conceivable with regard to the wavelength at which the semiconductor lasers are stabilized.

An advantageous approach provides that all semiconductor lasers are stabilized at the same wavelength.

For other applications, however, it may also be advantageous to externally stabilize the semiconductor lasers at different wavelengths.

That is, it is possible, for example, to divide the semiconductor lasers into groups, each of the groups being externally stabilized at a particular wavelength which differs from the wavelength at which the respective other groups are stabilized.

According to the invention, however, it is also possible for each semiconductor laser of the laser system according to the invention to be stabilized at a wavelength that is different from the other semiconductor lasers.

In this case, the concept of the different wavelengths is thus maintained, which has the advantage that in this case the laser radiation fields generated by the respective semiconductor lasers may be superimposed in a particularly easy manner.

If one considers the above-described concepts using different wavelengths in conjunction with semiconductor laser bars, the semiconductor lasers are preferably externally stabilized at different wavelengths in the respective semiconductor laser bars.

This concept may be continued even further, in that the semiconductor lasers are externally stabilized in different semiconductor laser bars at wavelengths which differ from those of the other semiconductor laser bars.

Further features and advantages of the solution according to the present invention are the subject matter of the following description and the illustration of several exemplary embodiments in the drawings.

BRIEF DESCRIPTION OF THE DRAWINGS

FIG. 5 shows a cross-section of a first variant of a resonant waveguide grating according to the invention;

FIG. 8 shows a section, similar to FIG. 5, through a second variant of a waveguide grating according to the invention;

DETAILED DESCRIPTION OF THE INVENTION

Figure 1:
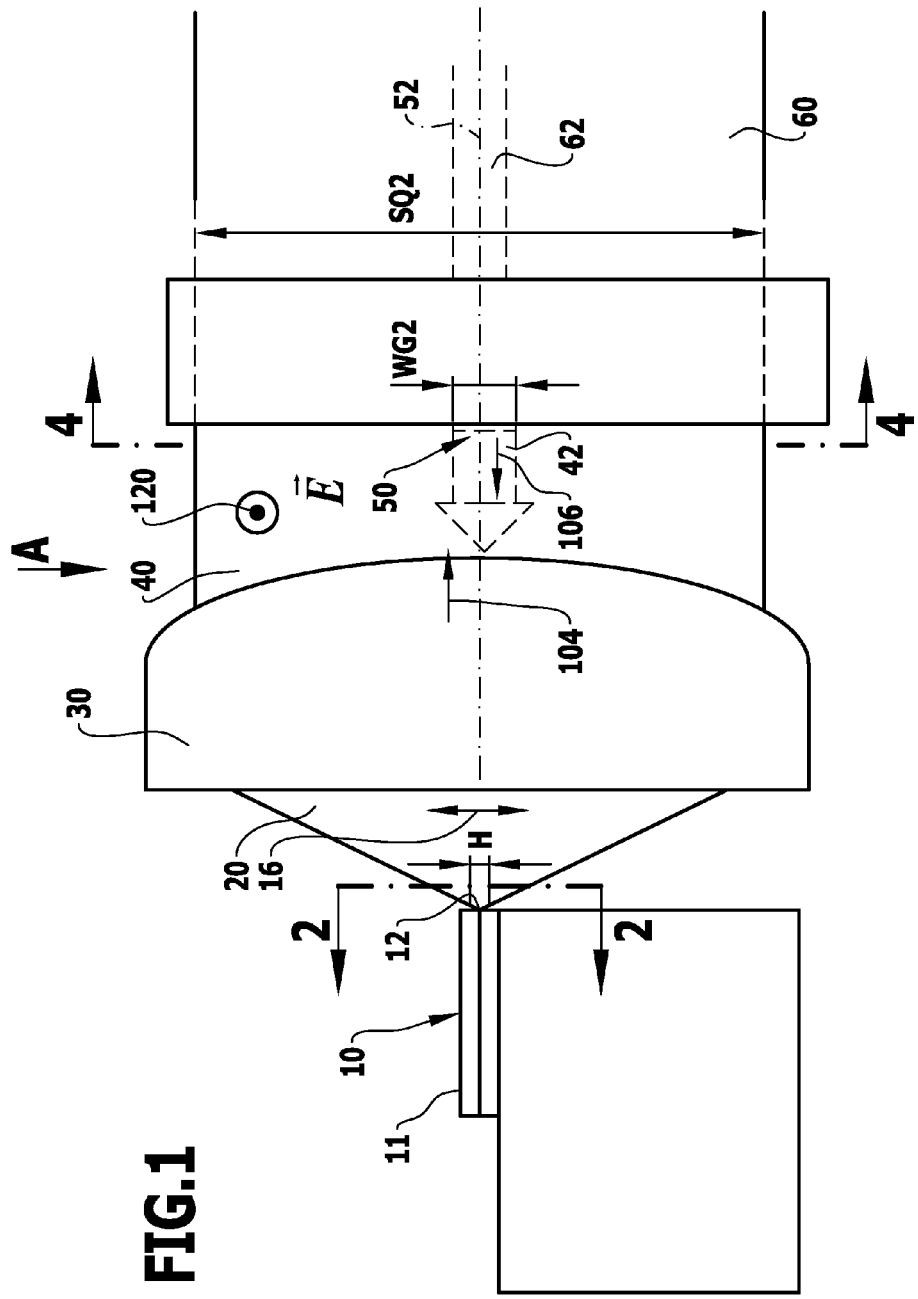
FIG. 1 shows a schematic side view of a first exemplary embodiment of a laser system according to the invention.
Figure 2:
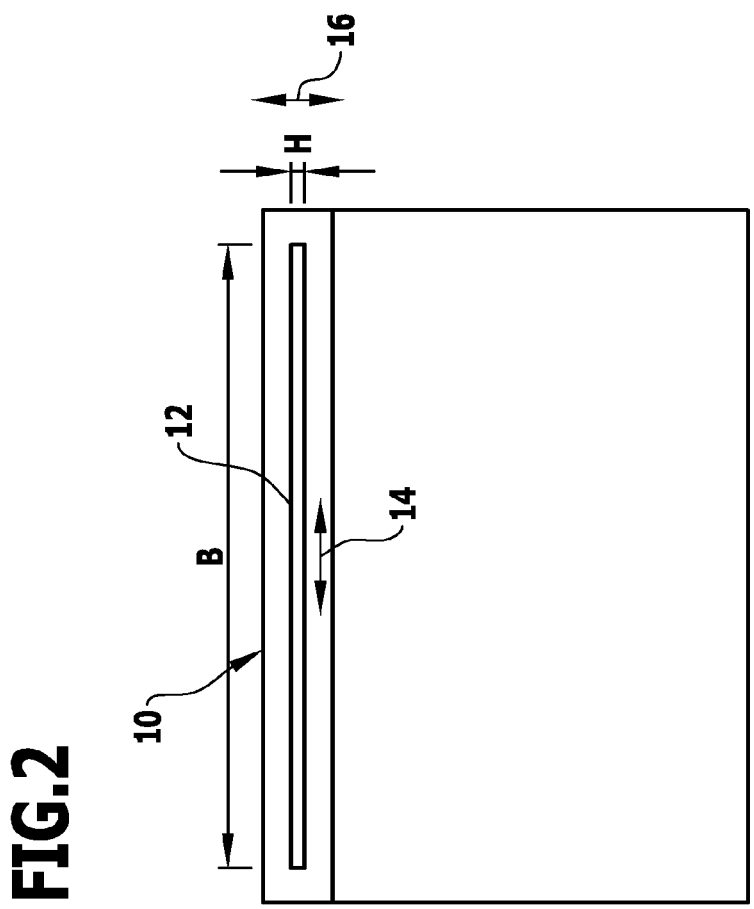
FIG. 2 shows a section along line 2-2 in FIG. 1.
Figure 3:
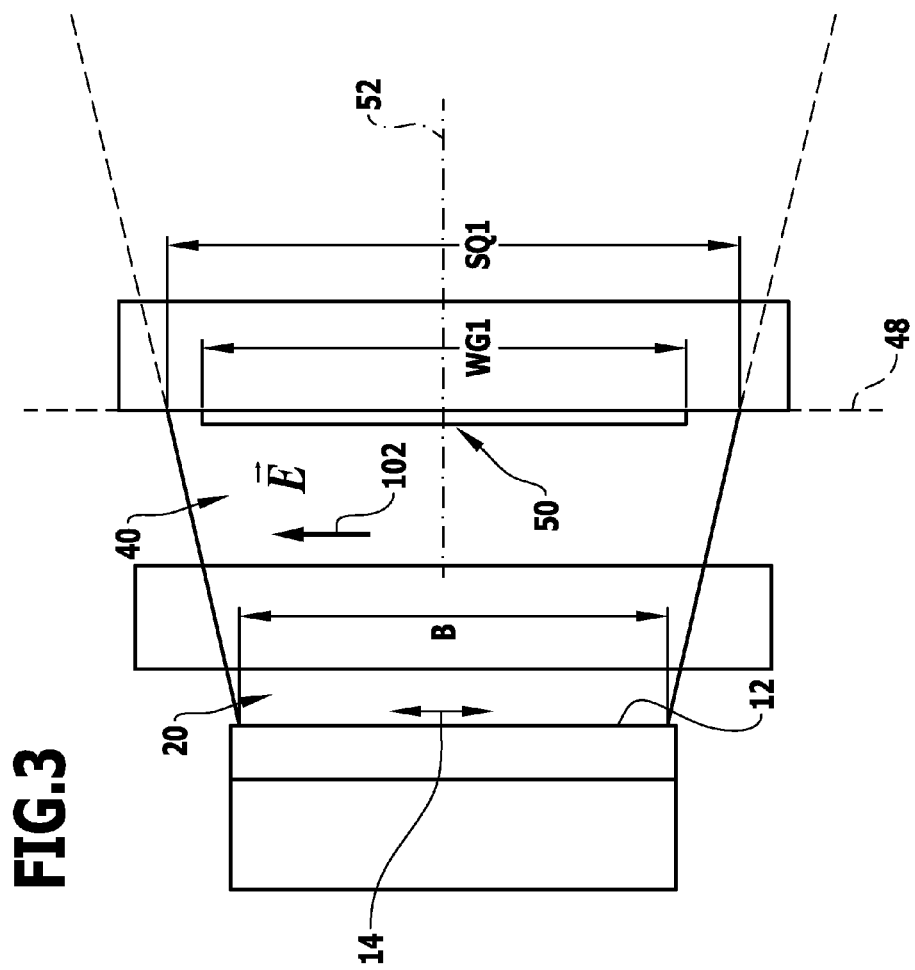
FIG. 3 shows a plan view, from the top, of the first exemplary embodiment of the laser system according to the invention in the direction of the arrow A in FIG. 1.

An exemplary embodiment, illustrated in FIG. 1, of a laser system according to the invention illustrated in FIGS. 1 to 3, includes a semiconductor laser, denoted overall by reference numeral 10, having a laser active zone 11 from whose emitting aperture 12 a laser radiation field 20 exits.

The emitting aperture 12 extends in a first direction 14 over a width B and in a second direction 16 over a height H, the width B being a multiple of the height H, preferably at least 50 times, preferably at least 80 times, of the height H. Typical values for the decoupling aperture are a width B of 100 μm and a height H of 1 μm.

The laser radiation field 20 exiting from the emitting aperture 12 has a low divergence in the direction parallel to the first direction 14, which at 95% power capacity is less than 30°, preferably less than 15°, while in the direction parallel to the second direction 16, the laser radiation field 20 has a divergence which at 95% power capacity is greater than 90°.

This divergent laser radiation field 20 is collimated, in the direction parallel to the first direction 14 as well as in the direction parallel to the second direction 16, with respect to its divergence in the direction parallel to the second direction 16, by a collimating lens 30, so that a radiation field 40 which is collimated in the second direction, and thus partially collimated overall, exits from the collimating lens, the radiation field 40 having the same divergence as the laser radiation field 20 in the first direction 14, as illustrated in FIG. 3.

To stabilize the laser radiation field 20 exiting from the semiconductor laser 10, as well as the partially collimated region 40 of the radiation field 20 formed therefrom, at a particular wavelength or in a particular wavelength range, a resonant waveguide grating 50 which extends in a transverse plane 48 is provided which, as illustrated in FIG. 3, extends, in the transverse plane 48 parallel to the first direction, with an extent WG1, which corresponds to at least 50% of an extent SQ1 of a radiation cross-section SQ in the transverse plane 48 parallel to the first direction 14.

The extent WG1 is preferably in the range between approximately 50% and approximately 80% of the extent SQ1 of the radiation cross-section SQ.

In addition, as illustrated in FIG. 1, the resonant waveguide grating 50 extends with an extent WG2, in the transverse plane 48 parallel to the second direction 16, which corresponds to at least 5%, at most 30%, of the extent SQ2 of the radiation cross-section SQ in the transverse plane 48 parallel to the second direction 16.

Furthermore, with regard to an optical axis 52 extending perpendicularly with respect to the transverse plane 48, the resonant waveguide grating 50 is arranged parallel to the first direction 14 and parallel to the second direction 16, in a symmetrical manner with respect to this optical axis 52, which represents a center axis for each of the laser radiation fields 20, 40.

The resonant waveguide grating 50 is used to reflect back a portion of the intensity of the laser radiation field 20 in the range of 5% to 30%, preferably in the range of 10% to 20%, as a feedback radiation field 42 in the direction of the semiconductor laser diode 10 in order to stabilize the laser conditions in the laser active zone 11 of the semiconductor laser diode 10 at a defined wavelength or in a defined wavelength range, only a small portion of the back-reflected intensity reaching the laser active zone 11 of the semiconductor laser diode 10.

That is, the extent of the resonant waveguide grating 50, assuming that it reflects back approximately 100% of the intensity in its area, should be dimensioned in such a way that it reflects the above-mentioned portion of the intensity back into the laser active zone 11 of the semiconductor laser 10, while the remaining intensity of the partially collimated region 40 of the laser radiation field 20, which is not back-reflected by the resonant waveguide grating 50, is available in the form of an exiting radiation field 60, the exiting radiation field 60 having, as a result of the back-reflection of the intensity in the region of the resonant waveguide grating 50, an intensity-free region 62, at least directly downstream from the resonant waveguide grating 50, which, however, is less noticeable in the far field due to diffraction effects at an outer contour of the resonant waveguide grating 50.

Figure 4:
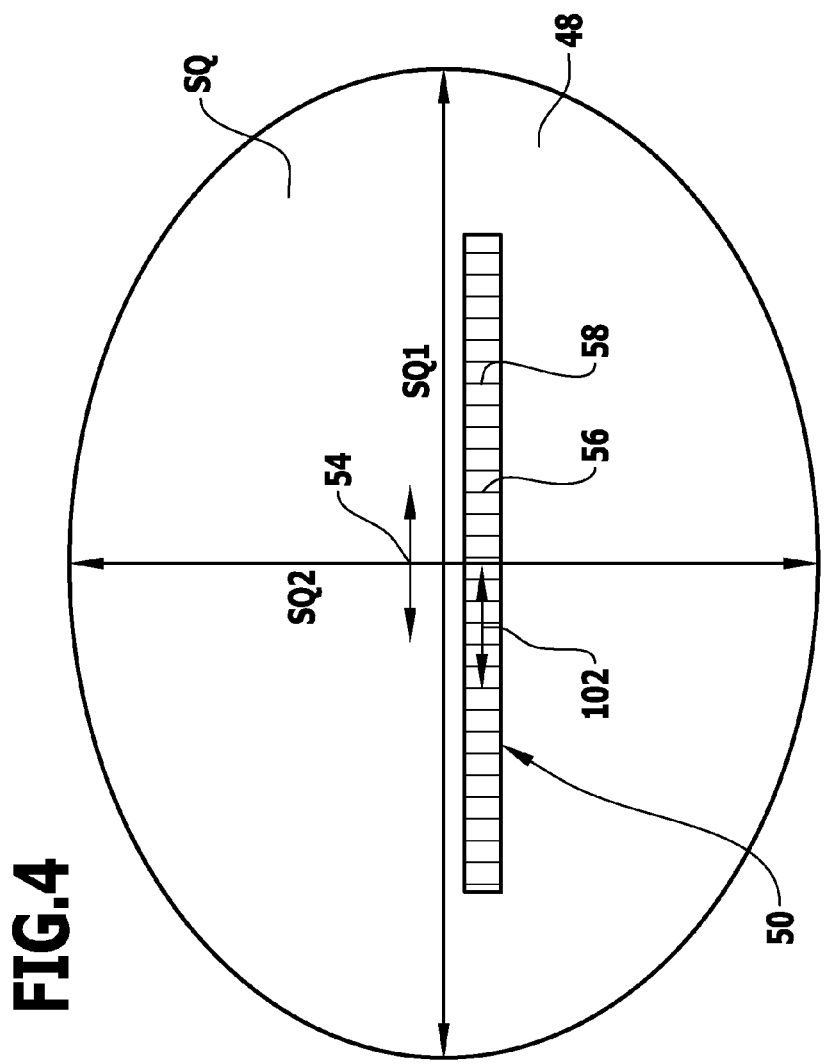
FIG. 4 shows a section along line 4-4 in FIG. 1.

In the first exemplary embodiment of the laser system according to the invention, the resonant waveguide grating 50, as illustrated in FIG. 4, is strip-shaped and extends in a longitudinal direction 54, while a grating structure 56 has structural elements 58 which are oriented transversely with respect to the longitudinal direction 54.

As illustrated in FIG. 5, for example, a first variant of the resonant waveguide grating 50 includes a substrate 70 having a surface structure 72 which has elevations 78 above a base surface 74 that follow one after the other in a row direction 76, an extent E of the elevations 78 in the row direction 76 as well as a distance A between the elevations 78 having a multiple periodicity, i.e., at least a double periodicity, and the elevations 78 extending, with the same cross-sectional area, transversely with respect to the row direction 76.

In the first exemplary embodiment, the row direction 76 extends parallel to the longitudinal direction 54, so that the elevations 78 extend, with their constant cross-section, transversely with respect to the longitudinal direction 54.

Figure 6:
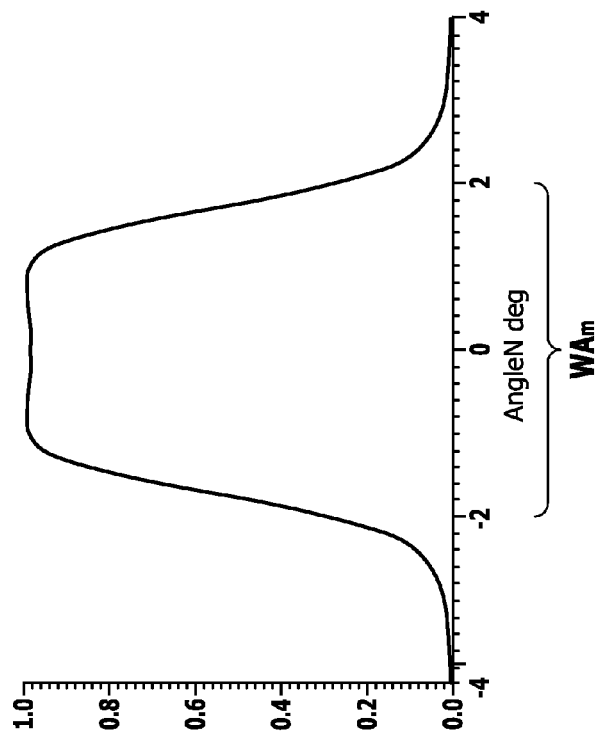
FIG. 6 shows an illustration of the angular acceptance of the first variant of the waveguide grating according to the invention.
Figure 7:
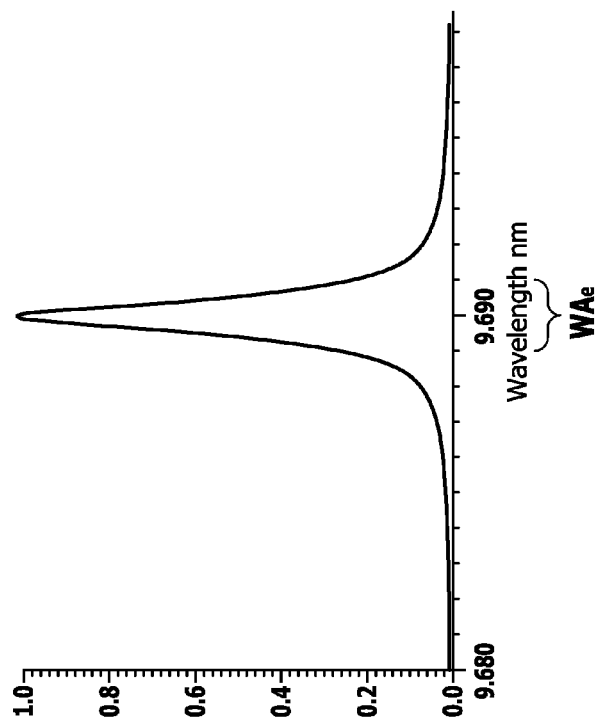
FIG. 7 shows an illustration of the angular acceptance of a waveguide grating according to the invention having single periodicity.

In the first exemplary embodiment of the resonant waveguide grating 50, a layer 82 having a higher index of refraction, and on same a layer 84 having a lower index of refraction, and on layer 84, a layer 86 once again having a higher index of refraction, each having a defined thickness, are applied to the surface structure 72 of the substrate 70, so that the surface structure 72 of the substrate continues through the layers 82, 84, and 86, and so that the layers 82, 84, and 86 form the resonant waveguide grating having multiple periodicity. As illustrated in FIG. 6, this type of resonant waveguide grating 50 having multiple periodicity has an expanded angular acceptance range $WA_m$, in a plane parallel to the row direction 76, for incident radiation which deviates from a normal 80, in contrast to an angular acceptance range $WA_e$ of a resonant waveguide grating having single periodicity, illustrated in FIG. 7.

The angular acceptance range is the angular range within which 95% of the reflected intensity is present.

The layers 82 and 86 having a higher index of refraction and the layer 84 having a lower index of refraction extend parallel to a plane 48, extending perpendicularly with respect to the normal 80, in which the resonant waveguide grating 50 is situated.

The expanded angular acceptance range $WA_m$ illustrated in FIG. 6 means that the resonant waveguide grating 50 is able to completely reflect beams which deviate by ±2° from the normal 80 to the resonant waveguide grating 50.

As an alternative to the first variant of the resonant waveguide grating 50 illustrated in FIG. 5, FIG. 8 illustrates a second variant of the resonant waveguide grating 50' in which the substrate 70 is provided with a restructured surface which extends parallel to the plane 48, and on which the layer 82' having a higher index of refraction, the layer 84' having a lower index of refraction, and the layer 86' once again having a higher index of refraction are situated, the layer 86' being provided with a surface structure 92 which likewise has a base surface 94, and elevations 98 which rise above the base surface 94 in a row direction 96 and which as a whole follow one after the other in the row direction 96 and have a constant cross-sectional surface transverse to the row direction 26.

The elevations 98 are likewise provided with an extent E in the direction of the row direction 96, and distances A are present between the elevations 98, so that the surface structure 92 likewise results in a multiple periodicity, preferably a double periodicity, which likewise results in the expanded angular acceptance relative to the normal 80, explained in FIG. 6 in conjunction with the first variant.

The functional principle of this type of resonant waveguide grating is described by A. Avrutskii et al. in the publication Sov. I. Quantum Electron. 16(8) August 1986, pp. 1063-1065.

Figure 9:
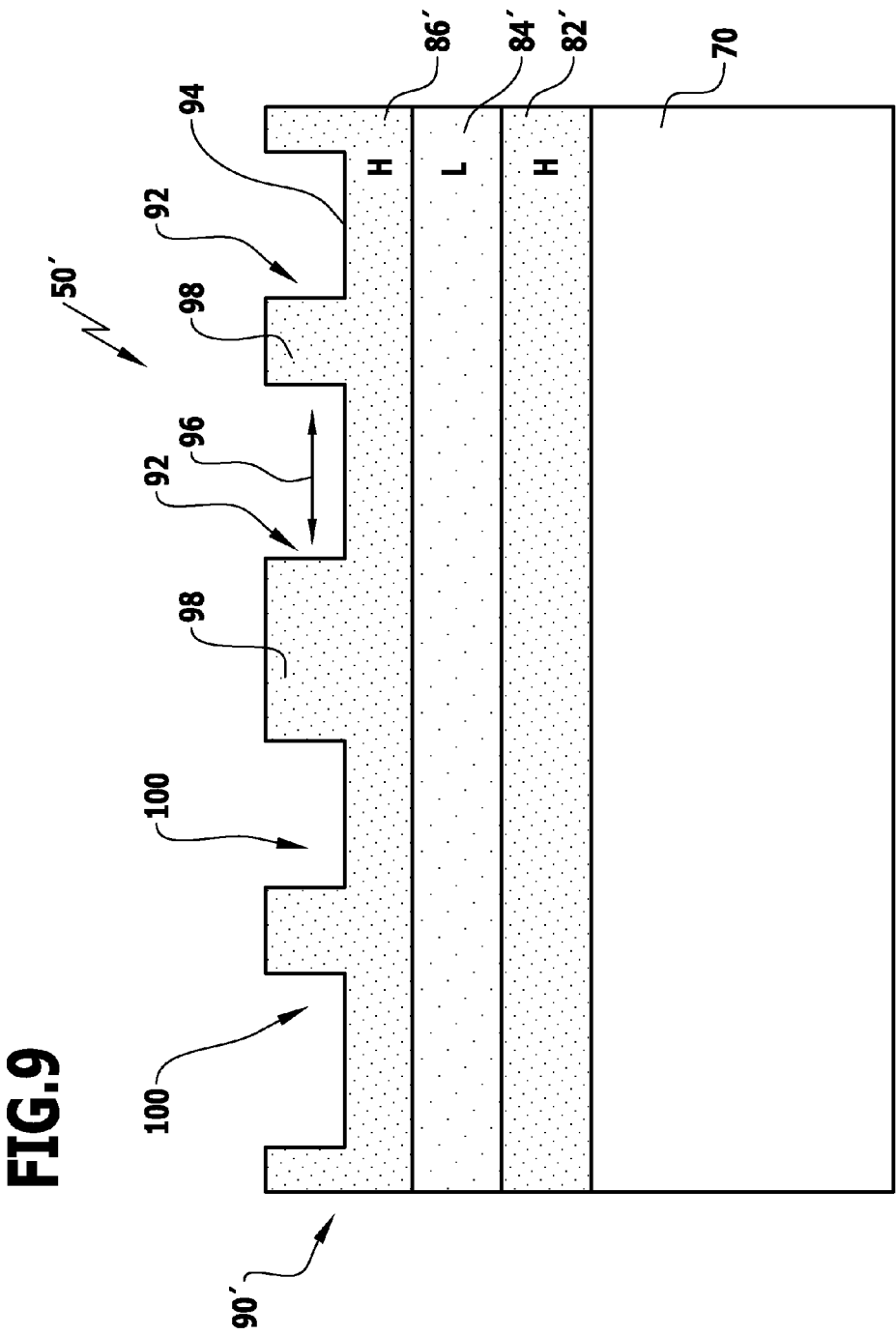
FIG. 9 shows an enlarged illustration of the second variant of the waveguide grating according to the invention.

FIG. 9 shows by way of example the parameters provided for a wavelength of $\lambda=969$ nm, which represents the resonance wavelength at which the entire intensity is reflected from the resonant waveguide grating 50'.

Further information concerning this type of resonant waveguide grating is found in Sentenac et al., JOSA A, Vol. 22, p. 475, 2005.

Materials such as $Ta_2O_5$, $HfO_2$, $Nb_2O_5$, or also $TiO_2$ or $Si_3N_4$, are preferably provided for the layers 82 and 84.

Materials such as $SiO_2$ are preferred for the layer 86.

Figure 10:
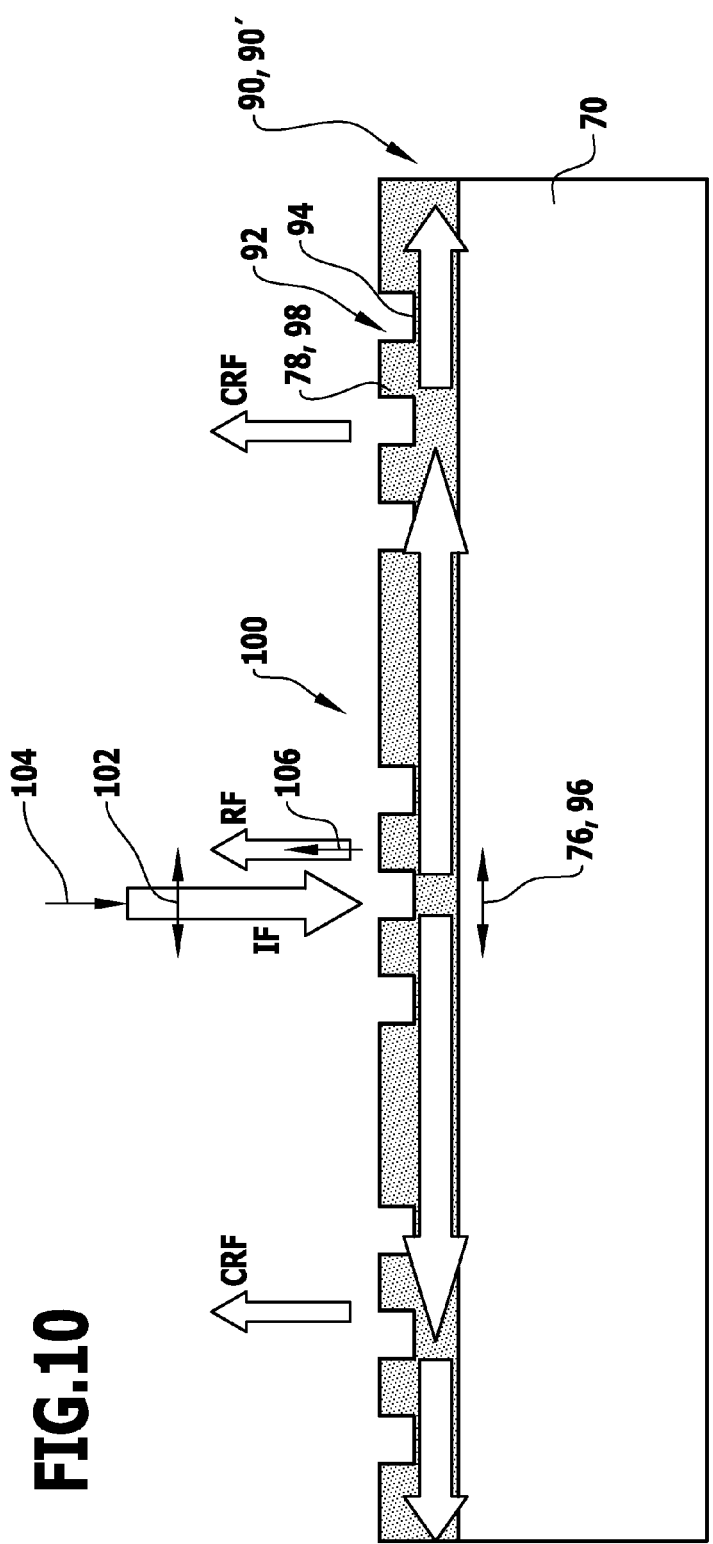
FIG. 10 shows a longitudinal section, similar to FIG. 8, through a strip-shaped waveguide grating according to the invention which is elongated in a row direction.

In summary, the basic principle of this type of resonant waveguide grating 50, 50' is that radiation fields IF impinging on a top side 100 facing away from the substrate 70, in a direction of incidence 104, with an electrical vector 102 of the electrical field which defines the polarization direction, are completely reflected by the layer system 90 or 90' in a back-reflection direction 106, when the radiation field is in the resonance wavelength range RW of the resonant waveguide grating 50, 50' and the vector 102 of the electrical field extends parallel to the row direction 76, 96, whereby, as illustrated in FIG. 10, a direct reflection results so that the reflected radiation field RF is generated, and wave guiding in the row direction 76, 96 also takes place in the layer system 90 or 90', and, offset from the row direction 76, 96, reflected radiation fields CRF which are coupled with the reflected radiation field RF and which propagate in the back-reflection direction 106 are coupled out.

Figure 11:
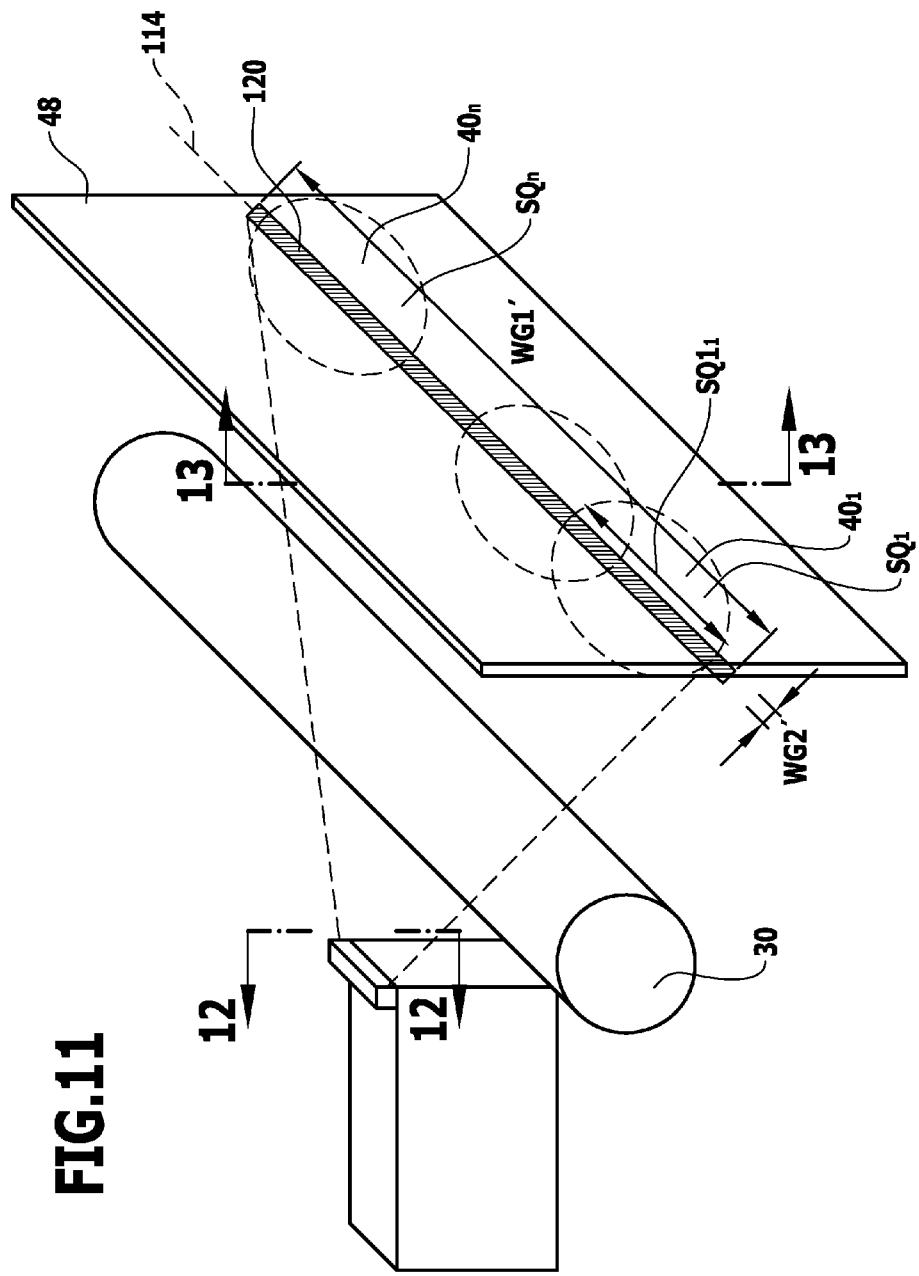
FIG. 11 shows a perspective view of a second exemplary embodiment of a laser system according to the invention.
Figure 12:
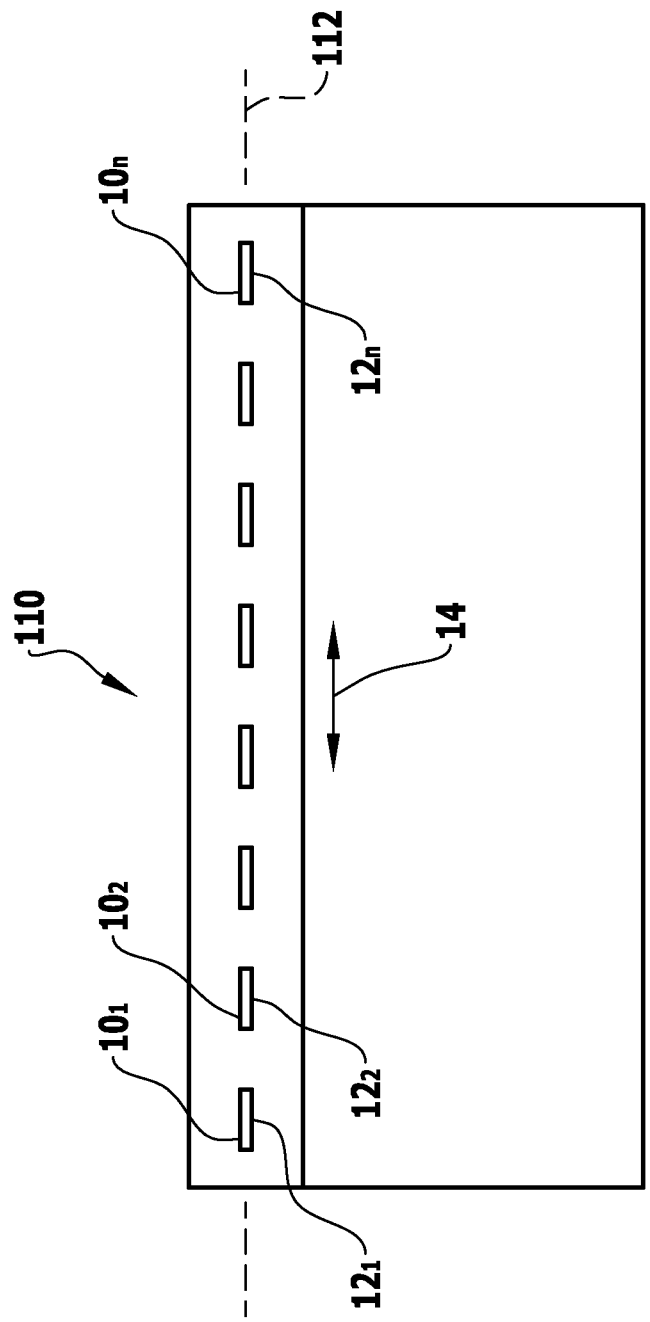
FIG. 12 shows a section along line 12-12 in FIG. 11.

In a second exemplary embodiment, illustrated in FIG. 11 and FIG. 12, a semiconductor laser bar denoted overall by reference numeral 110 includes a multiplicity of semiconductor lasers $10_1$ to $10_n$ which are all arranged in a row at a distance from one another in a row direction 112 parallel to the first direction 14, and which, as illustrated in FIG. 11, generate partially collimated areas $40_1$ to $40_n$ of the laser radiation fields $20_1$ to $20_n$ having radiation cross-sections SQ, which are likewise situated in a plane parallel to the plane 48 in the direction 114 parallel to the row direction 112, but which overlap one another due to the divergence in the first direction 14 which is not compensated for by the collimating lens 30, since the extent SQ1 of the radiation cross-sections SQ in the direction 114 parallel to the first direction is greater than the distance between successive emitting apertures $12_1$ to $12_n$ in the row direction 112 of the semiconductor laser bar 110.

Also situated in the plane 48 is a strip-shaped resonant waveguide grating 120 which is provided with base structures corresponding to one of the waveguide gratings 50, 50', and which extends continuously, parallel to the direction 114, and passes through all radiation field cross-sections $SQ_1$ to $SQ_n$.

The resonant waveguide grating 120 has the same structure as the resonant waveguide grating 50', but in the row direction 96', extends through all radiation cross-sections SQ.

In addition, the strip-shaped resonant waveguide grating 120 has an extent WG2' transverse to the direction 114 which corresponds to the extent WG2 of the first exemplary embodiment, while the extent WG1' of the strip-shaped resonant waveguide grating 120 corresponds to a multiple of the extent SQ1 of the radiation field cross-sections SQ in the first direction 14.

The resonant waveguide grating 120 now brings about a back-reflection at the specified resonance wavelength in each of the collimated laser radiation fields 20, as described in conjunction with the first exemplary embodiment.

Figure 13:
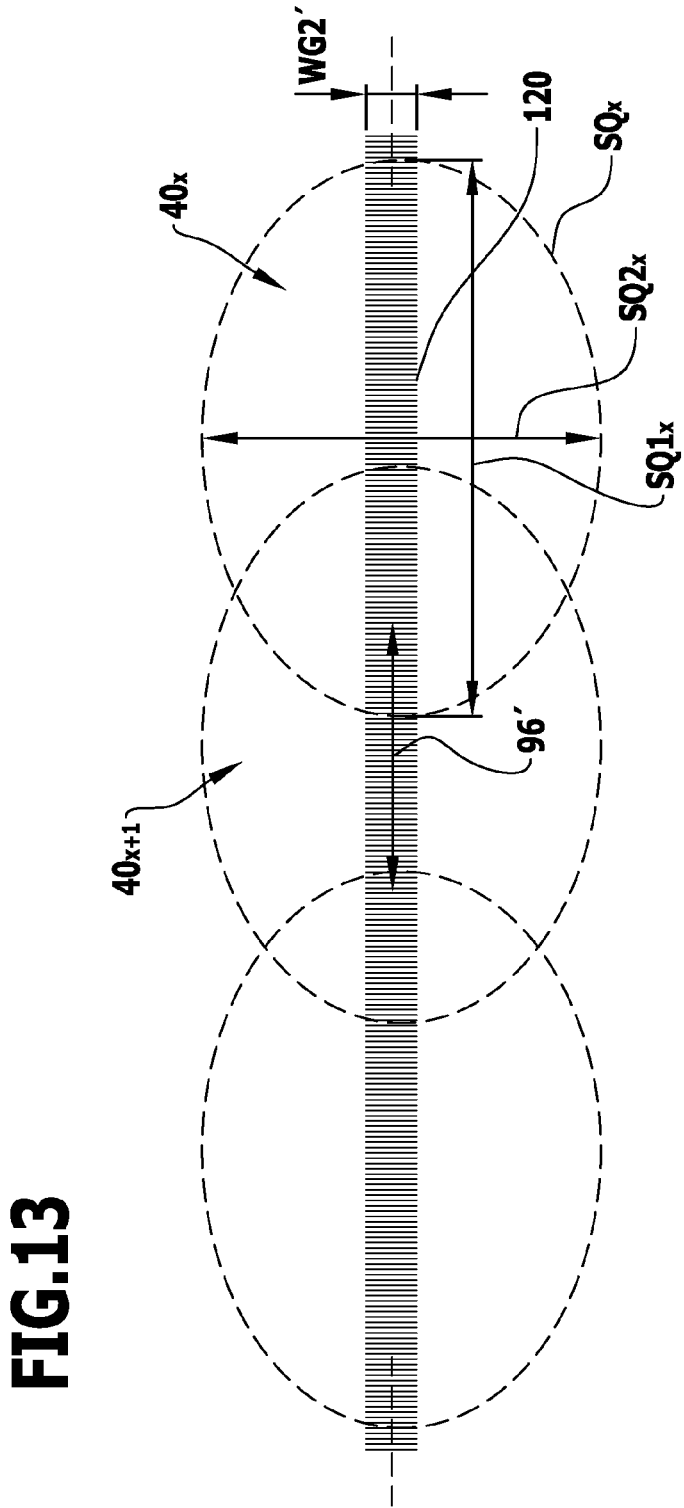
FIG. 13 shows a section along line 13-13 in FIG. 11.

Furthermore, as a result of the limited wave guiding at the resonance wavelength RW in the row direction 96, and the back-reflected radiation fields RF and CRF, the laser radiation fields 40 of the respective adjacent semiconductor lasers 10 are coupled with one another, so that as a whole, the semiconductor lasers $10_1$ to $10_n$ of the laser bar 110 are thus coupled with one another with regard to the wavelength at which they operate due to the resonant waveguide grating 120, as illustrated in FIG. 13.

Figure 14:
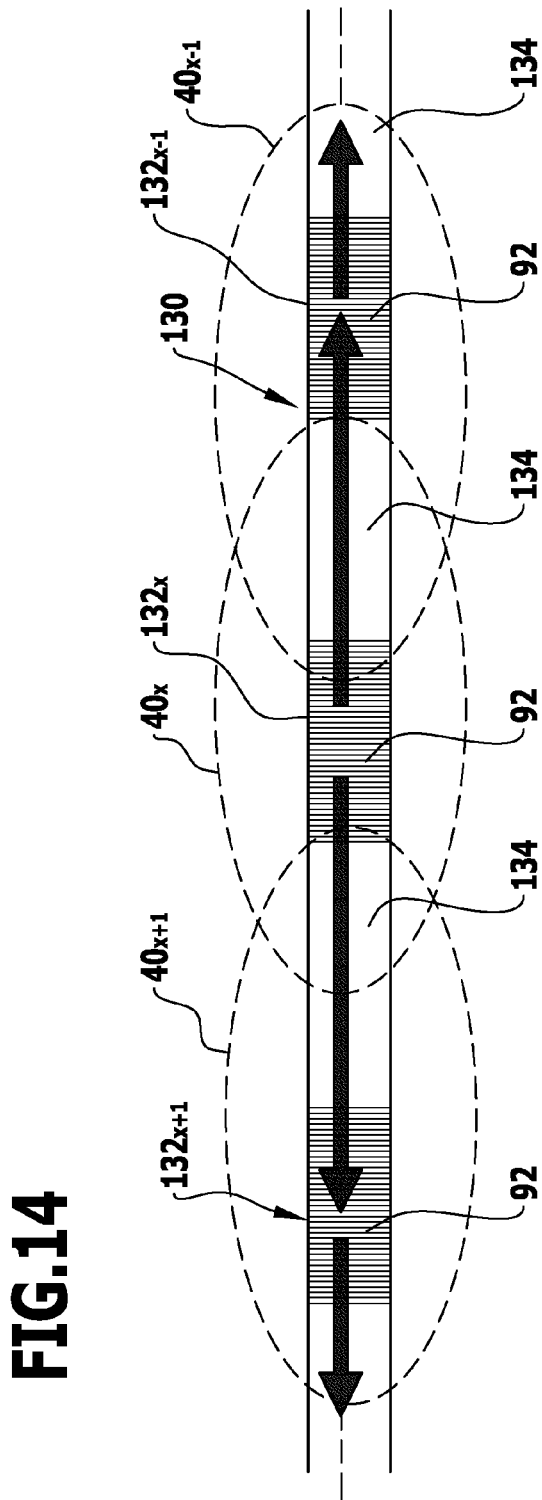
FIG. 14 shows a section, similar to FIG. 13, through a third exemplary embodiment of a laser system according to the invention.

In a third exemplary embodiment of a laser system according to the invention illustrated in FIG. 14, the resonant waveguide grating 130, similarly as described for the first exemplary embodiment in conjunction with FIG. 10, includes regions 132 having the surface structure 92 and regions 134 without the surface structure 92, whereby no input, emission, or back-reflection of the radiation field occurs from regions 134; rather, coupling in as well as coupling out and back-reflection occur only in the regions 132 having the surface structure 92.

As a result, coupling between the regions 132 occurs, for example due to input of laser radiation into the region $132_x$, coupling with the regions $132_{x+1}$ and $132_{x-1}$ occurs, from which emission with back-reflection of the laser radiation once again occurs. If the regions $132_x$ are now situated in such a way that in each case approximately centrally with respect to the corresponding region 40 of the laser radiation field 20, for example with respect to the region $40_x$, laser radiation is coupled in, then by wave guiding, the laser radiation is conducted to the regions $40_{x+1}$ and $40_{x-1}$, where it is reflectively coupled out.

Figure 15:
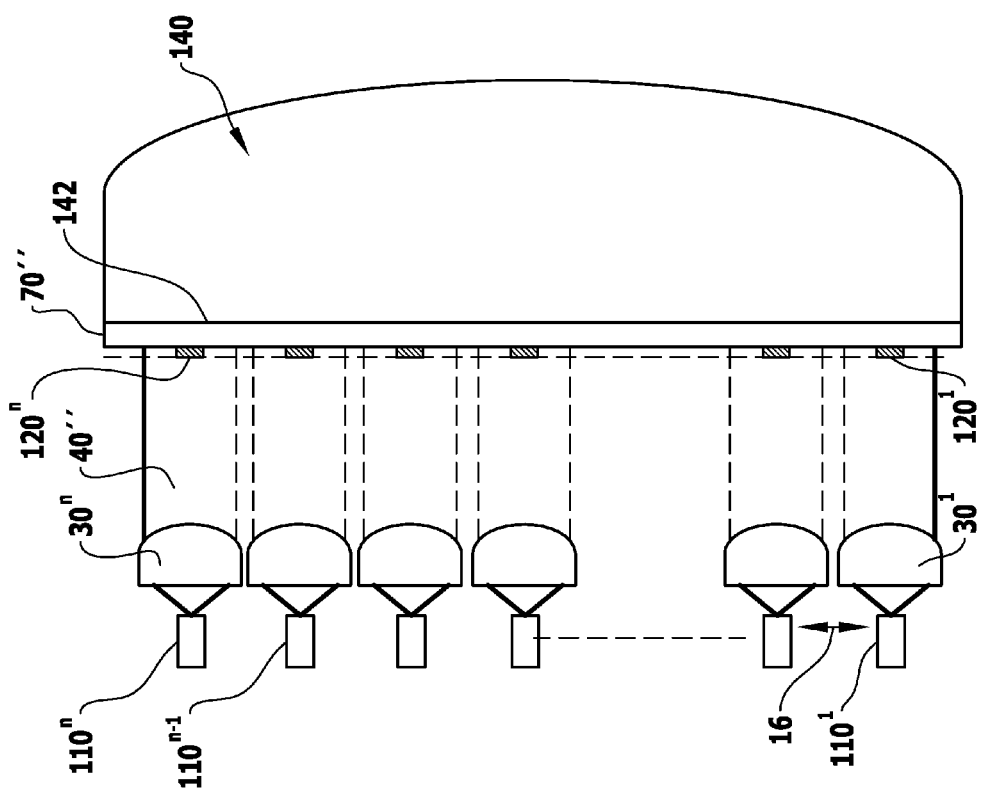
FIG. 15 shows a partial section, similar to FIG. 1, through a fourth exemplary embodiment of a laser system according to the invention.

In a fourth exemplary embodiment of a laser system according to the invention illustrated in FIG. 15, a multiplicity of laser bars $110^1$ to $110^n$ are situated one above the other in the direction of the second direction 16, and a separate collimating lens $30^1$ to $30^n$ is provided for each of the laser bars 110, so that the partially collimated regions 40 of the laser radiation fields are all partially collimated in the second direction 16, and impinge on waveguide gratings $120^1$ to $120^n$ which are provided for each of the laser bars 110 and which are situated, for example, on a shared substrate 70" which in turn is situated on a rear side 142 of a focusing lens 140 shared by the partially collimated regions 40" of the laser radiation fields 20, so that the substrate 70" is held by the lens 140.

Thus, in each of the laser bars 110, all individual semiconductor lasers $10_1$ to $10_n$ are coupled by the respective resonant waveguide grating 120, but there is no coupling of the partially collimated regions 40 with a laser bar $110^{x+1}$ or $110^{x-1}$ situated thereabove or therebeneath, respectively.

Figure 16:
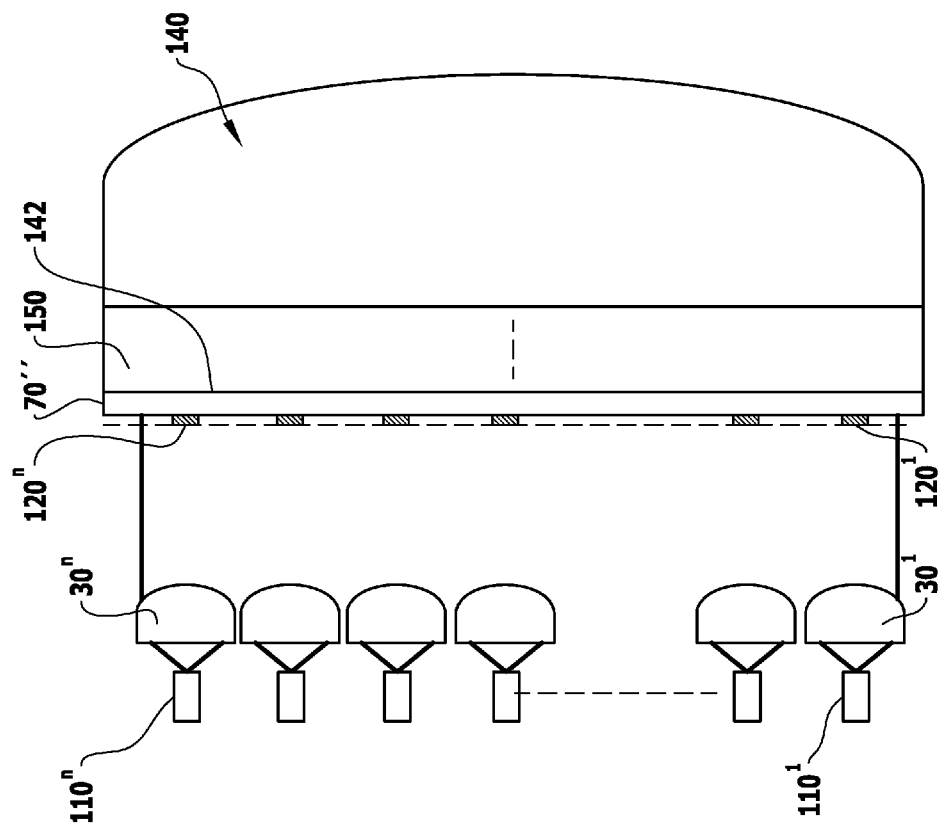
FIG. 16 shows a section, similar to FIG. 15, through a fifth exemplary embodiment of a laser system according to the invention.

As an alternative to the fourth exemplary embodiment, in a fifth exemplary embodiment illustrated in FIG. 16, the substrate 70 is not provided on the rear side 142 of the lens 140;

instead, an optically transparent heat sink 150 made of sapphire, for example, is located on the rear side, the heat sink, on its side facing the laser bar 110, carrying the substrate 70" having the resonant waveguide gratings 120.

By means of the heat sink 150, it is easily possible to optimally dissipate the heat generated in the resonant waveguide gratings 120, and in particular to maintain the waveguide gratings 120 at a constant operating temperature, since the operating temperature also has an effect on the resonance wavelength.

Figure 17:
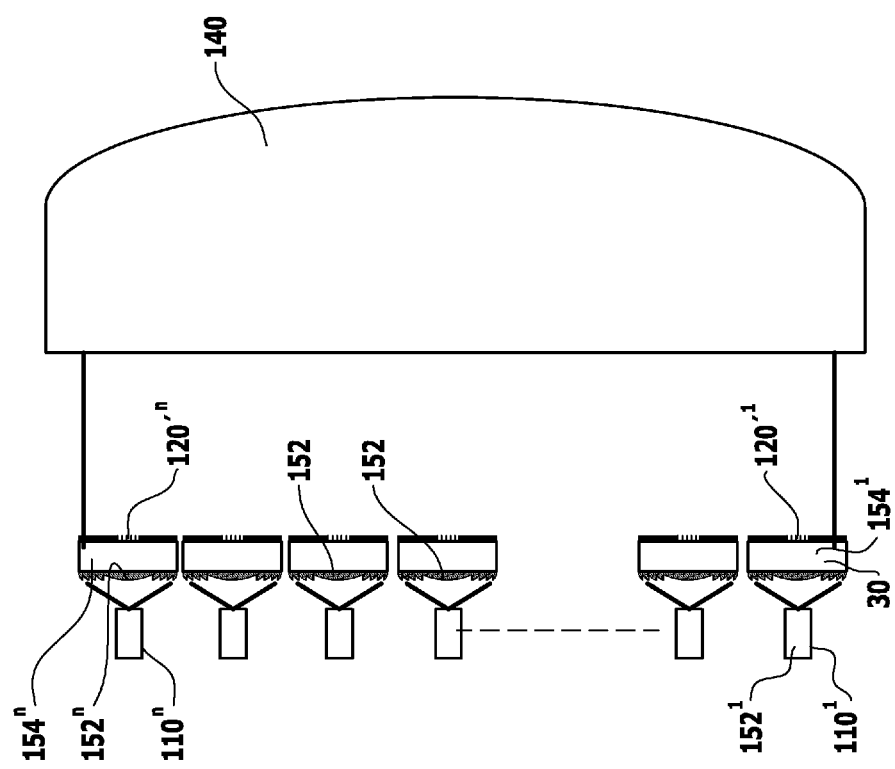
FIG. 17 shows a section, similar to FIG. 15, through a sixth exemplary embodiment of a laser system according to the invention.
Figure 18:
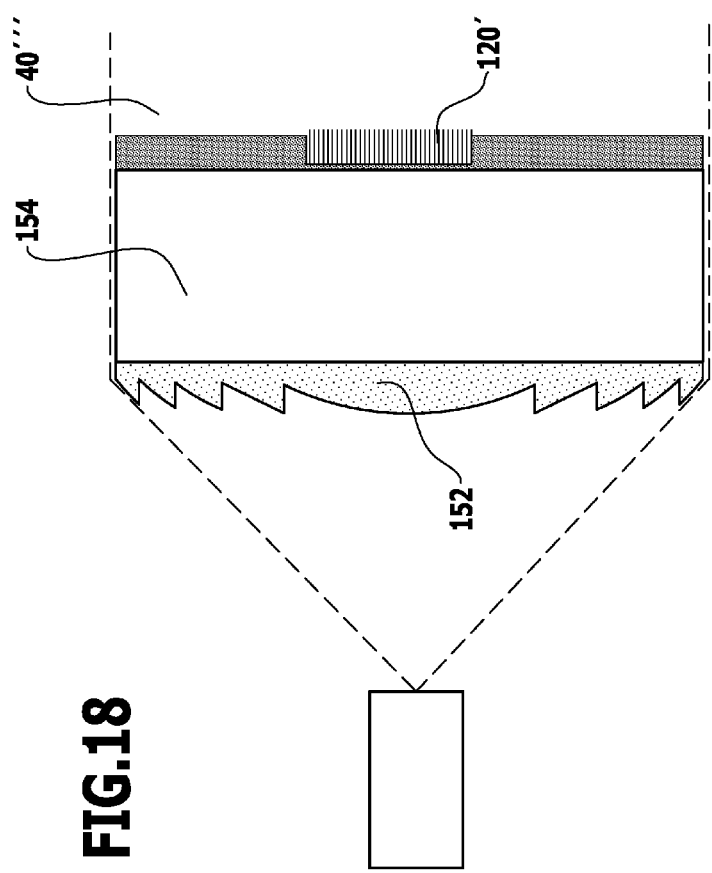
FIG. 18 shows an enlarged illustration of a collimating lens in the sixth exemplary embodiment of the laser system according to the invention.

In a sixth exemplary embodiment, illustrated in FIGS. 17 and 18, the collimating lenses 30'$^1$ to 30'" are formed from a Fresnel lens 152 which is situated on one side of an optically transparent heat sink 154, and the waveguide grating 120'$^1$ to 120'" associated with the respective semiconductor laser bar 110$^1$ to 110" is situated on a side of the heat sink 154 opposite from the Fresnel lens 152, since the collimated region 40'" is already present on this side of the heat sink 154.

The respective waveguide grating 120'$^1$ to 120'" has a design corresponding to the second, third, or fourth exemplary embodiment.

Figure 19:
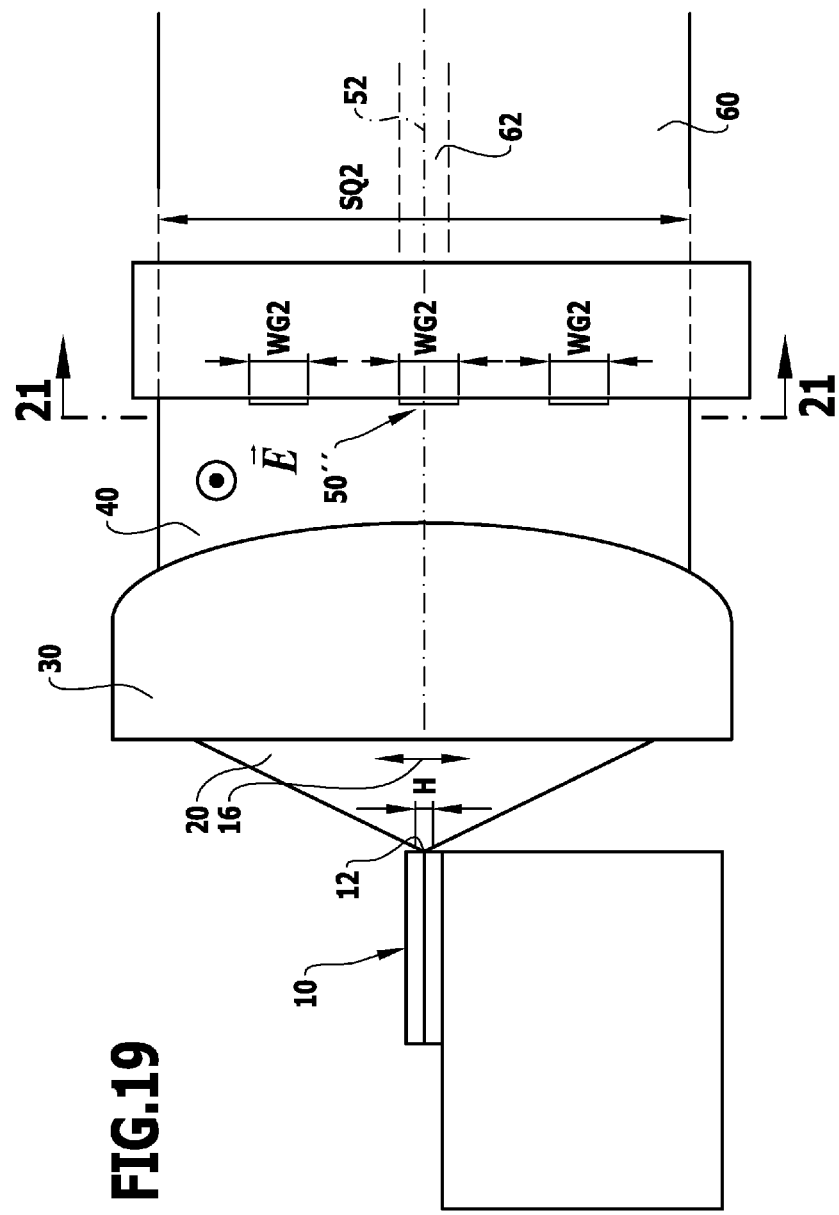
FIG. 19 shows a side view, similar to FIG. 1, of a seventh exemplary embodiment of a laser system according to the invention.
Figure 20:
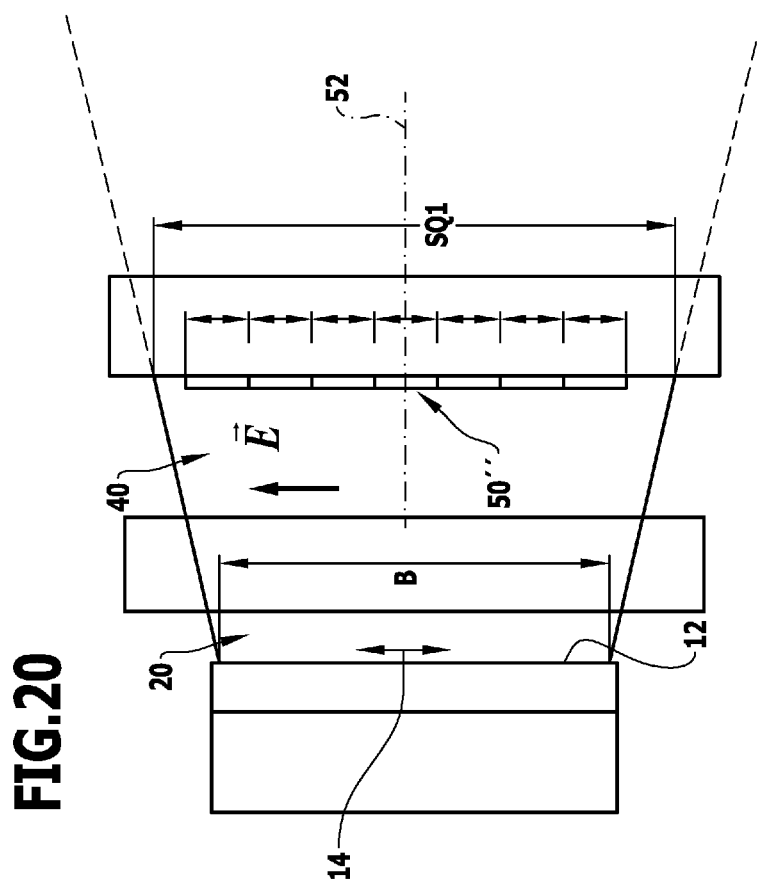
FIG. 20 shows a plan view, similar to FIG. 3, of the seventh exemplary embodiment of the laser system according to the invention.
Figure 21:
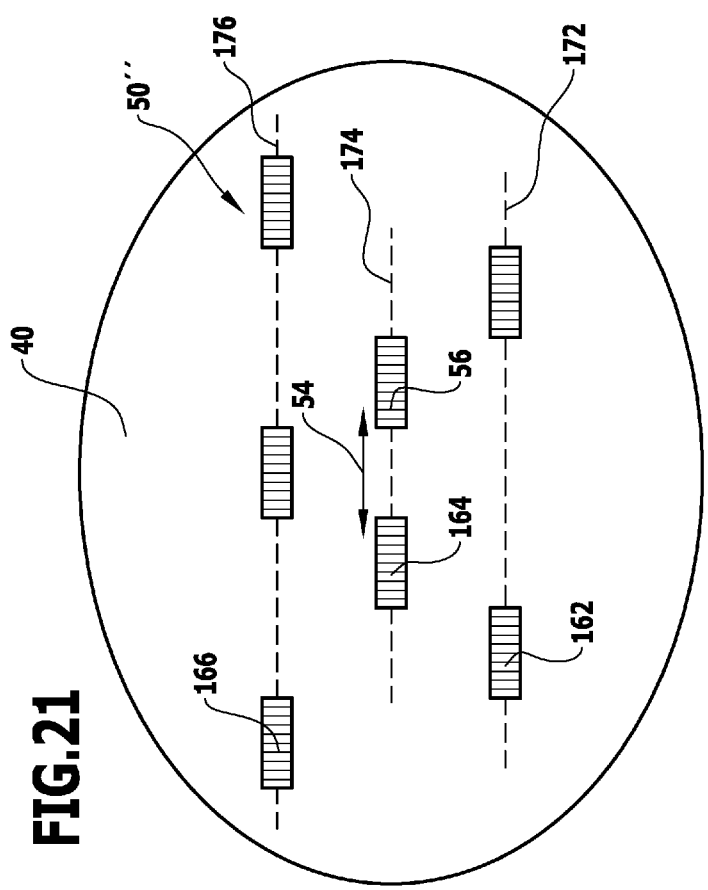
FIG. 21 shows a section along line 21-21 in FIG. 19.

In contrast to the preceding exemplary embodiments, in which in each case it was assumed that a continuous strip-shaped resonant waveguide grating 50, 120 is used, a seventh embodiment illustrated in FIGS. 19 to 21 provides that the waveguide grating 50", which acts reflectively on the partially collimated region 40, is composed of a multiplicity of grating patches 162, 164, 166, whereby the grating patches 162, 164, and 166 may be statistically distributed within the radiation cross-section SQ of the radiation field 40 or are uniformly arranged, for example, as illustrated in FIG. 21, in each case two grating patches 162 being situated in a row direction 172 parallel to the first direction 14, grating patches 164 being situated in a row direction 174 parallel to the first direction 14, and grating patches 166 being situated in a row direction 176 parallel to the first direction 14, and the grating patches 162, 164, and 166 being situated at a distance from one another along the respective row direction 172, 174, and 176.

To include the highest possible number of transversal modes of the laser radiation field 20 in the partially collimated region 40, the grating patches 162, 164, and 166 are all arranged in such a way that the grating patches 162, 164, and 166 receive and reflect back areas of the radiation cross-section SQ, preferably in a distribution over an extent SQ1 of the radiation cross-section SQ parallel to the first direction 14.

An advantageous arrangement provides that a projection of the grating patches 162, 164, and 166 on one of the row directions 172, 174 or 176, as illustrated in FIG. 20, results in the grating patches 162, 164, and 166 being distributed parallel to the first direction over at least 80% of the extent SQ1 of the radiation cross-section SQ parallel to the first direction 14, and thus, within this area of 80% of the extent SQ1, being able to reflect transversal modes of the laser radiation field 20 in the partially collimated region 40.

The grating patches 162, 164, and 166 are preferably arranged in such a way that, when projected on one of the row directions 172, 174, and 176, they are either situated at small distances from one another, abut one another, or even overlap in the respective row direction 172, 174, or 176.

The advantage of this exemplary embodiment is that the intensity-free regions of the laser radiation field 40 which result from the resonant waveguide grating may thus be obtained not as contiguous regions, but as distributed regions, so that the overall beam quality in the far field is impaired as little as possible.

The grating patches 162, 164, and 166 are preferably provided as resonant waveguide gratings 50' which are designed and constructed as described in conjunction with the first exemplary embodiment, for example.

Figure 22:
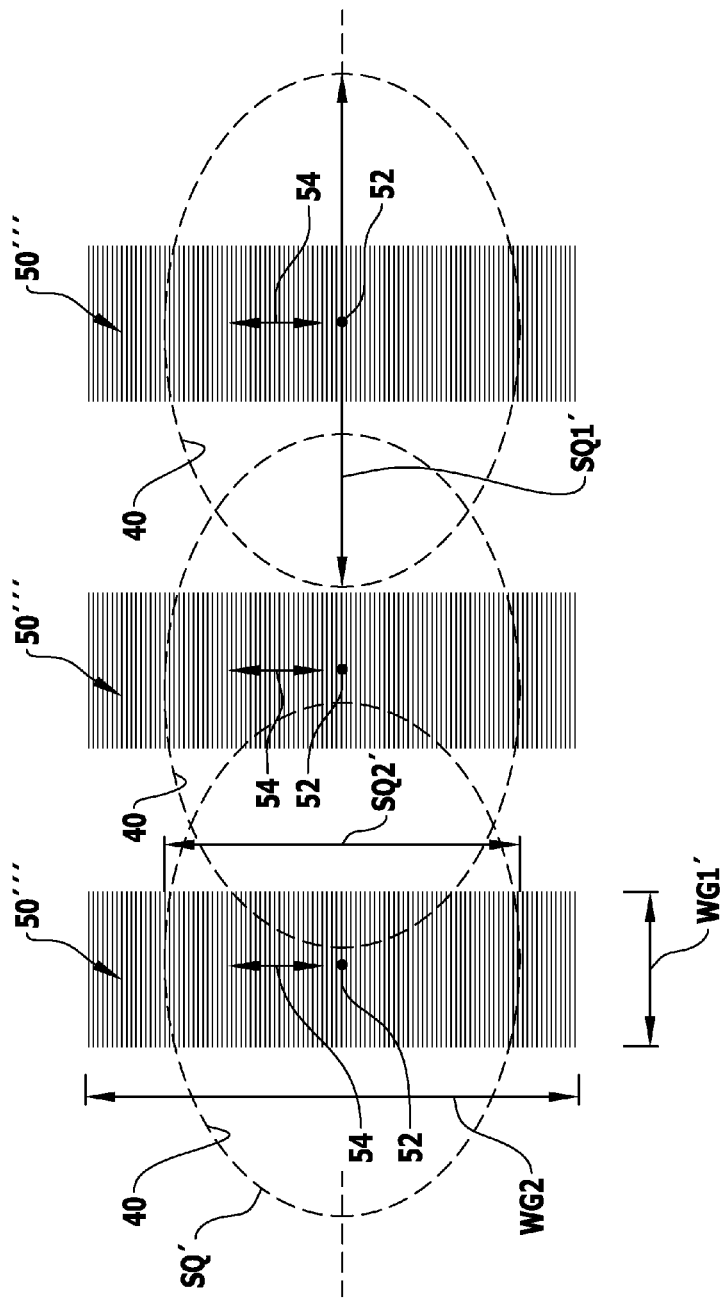
FIG. 22 shows an illustration, similar to FIG. 13, of an eighth exemplary embodiment of a laser system according to the invention.

In an eighth exemplary embodiment of a laser system according to the invention, illustrated in FIG. 22, a resonant waveguide grating 50'" is provided for each of the collimated laser radiation fields 40 and, in contrast to the preceding exemplary embodiments, extends with its respective longitudinal direction 54 parallel to the second direction 16, and thus, transversely or preferably perpendicularly with respect to the first direction 14.

To be able to reflect back a sufficient number of transversal modes, the extent WG1' of the resonant waveguide grating 50'" is large enough that it is at least 20% of the extent SQ1 of the radiation cross-section SQ in the first direction 16.

In addition, the resonant waveguide grating 50'" has an extent WG2 in the second direction 16 which is at least 80% of the extent SQ2' of the extent of the radiation cross-section SQ' in the second direction.

A resonant waveguide grating 50" arranged in this way must thus back-reflect polarized laser radiation fields 20' parallel to the second direction 16 and also include a sufficiently large number of transversal modes.

In other respects, the eighth exemplary embodiment of the laser amplifier system according to the invention operates similarly as in the preceding exemplary embodiments, so that full reference may be made to the statements regarding same.

Figure 23:
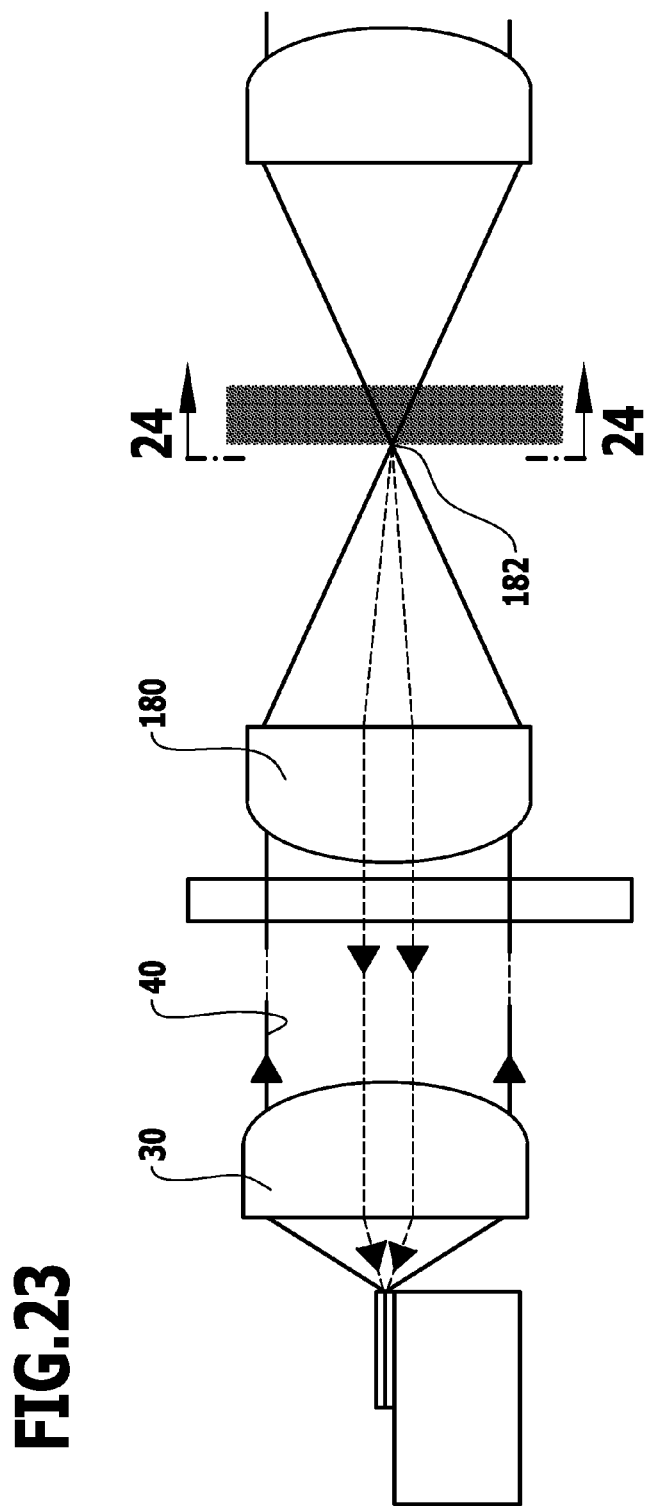
FIG. 23 shows a side view, similar to FIG. 1, of a ninth exemplary embodiment of a laser system according to the invention.
Figure 24:
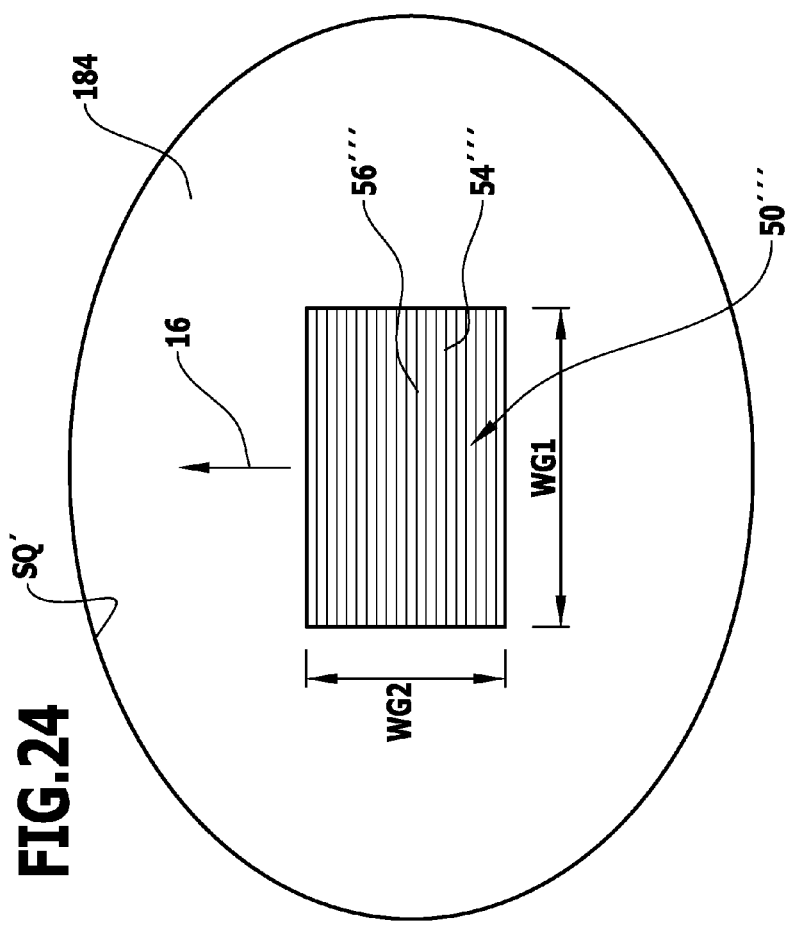
FIG. 24 shows a section along line 24-24 in FIG. 23.

In a ninth exemplary embodiment of a laser amplifier system according to the invention, illustrated in FIG. 23 and FIG. 24, the partially collimated region 40 of the radiation field 20 is focused on an intermediate focus area 184 by a focusing lens 180 having a longer focal length than the collimating lens 30, and situated within this intermediate focus area 184 is a resonant waveguide grating 50'" whose grating structure 56'" has structural elements 54'" oriented transversely with respect to the second direction 16, similarly as for the eighth exemplary embodiment.

For example, the resonant waveguide grating 50'" extends, with its the extent WG1, in the first direction approximately over the same distance as in the eight exemplary embodiment, i.e., over more than 20%, for example, but with its extent WG2 extends in the second direction 16 over at most 30% of a radiation cross-section SQ' in the focus area 184.

In this exemplary embodiment, due to the focused incidence of the laser radiation field 20 on the resonant waveguide grating 50'", only the portion of the incident laser radiation field 20 situated within the region of the angular acceptance of ±2°, explained in conjunction with the first exemplary embodiment, is reflected, while the remaining portion of the laser radiation field passes through the resonant waveguide grating 50'", so that, due to the direction of incidence of the laser radiation field 20, only a fraction of the intensity of the incident laser radiation field 20 is reflected by the resonant waveguide grating 50'".

Figure 25:
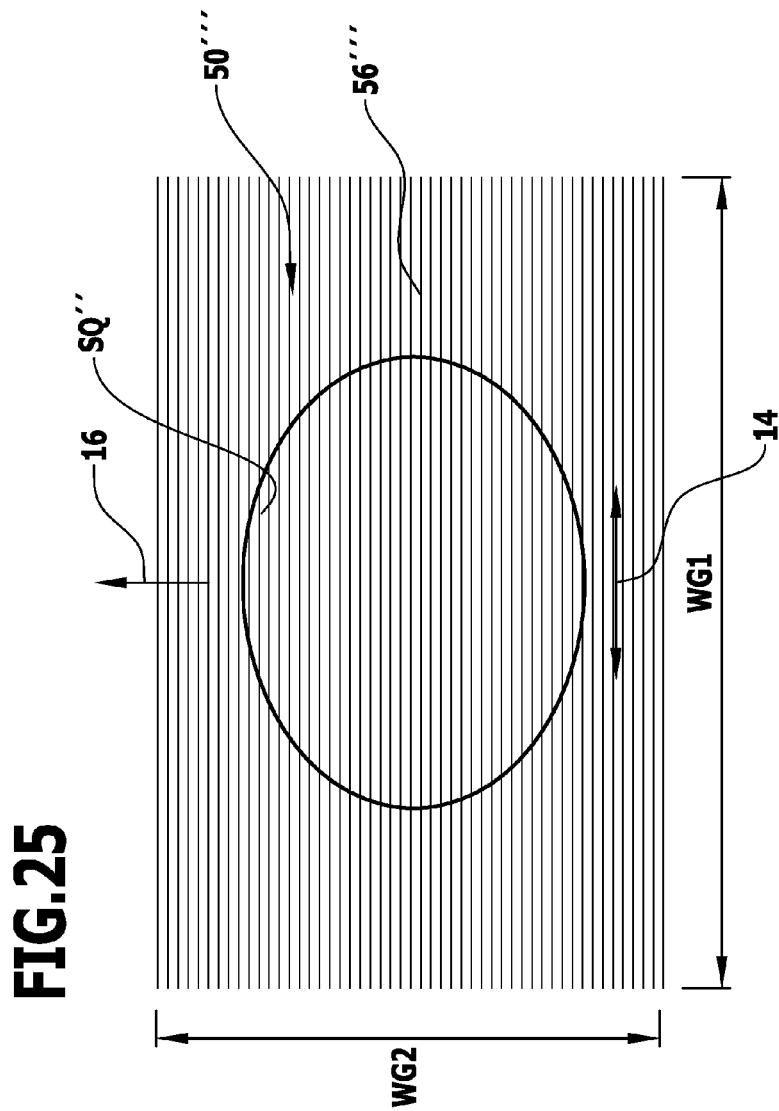
FIG. 25 shows a section, similar to FIG. 24, through a tenth exemplary embodiment of a laser system according to the invention.

Therefore, in a tenth exemplary embodiment it is also possible to design the waveguide grating 50'" to be large enough that the entire radiation cross-section SQ" in the focus area impinges on the waveguide grating 50'", as illustrated in FIG. 25.

In other respects, the tenth exemplary embodiment corresponds to the ninth exemplary embodiment, to which reference is made with regard to the remaining features.

In all exemplary embodiments subsequent to the first exemplary embodiment, elements which are identical to those of one of the preceding exemplary embodiments are provided with the same reference numerals, so that with regard to these elements, in each case reference is made to the preceding exemplary embodiments.

Figure 26:
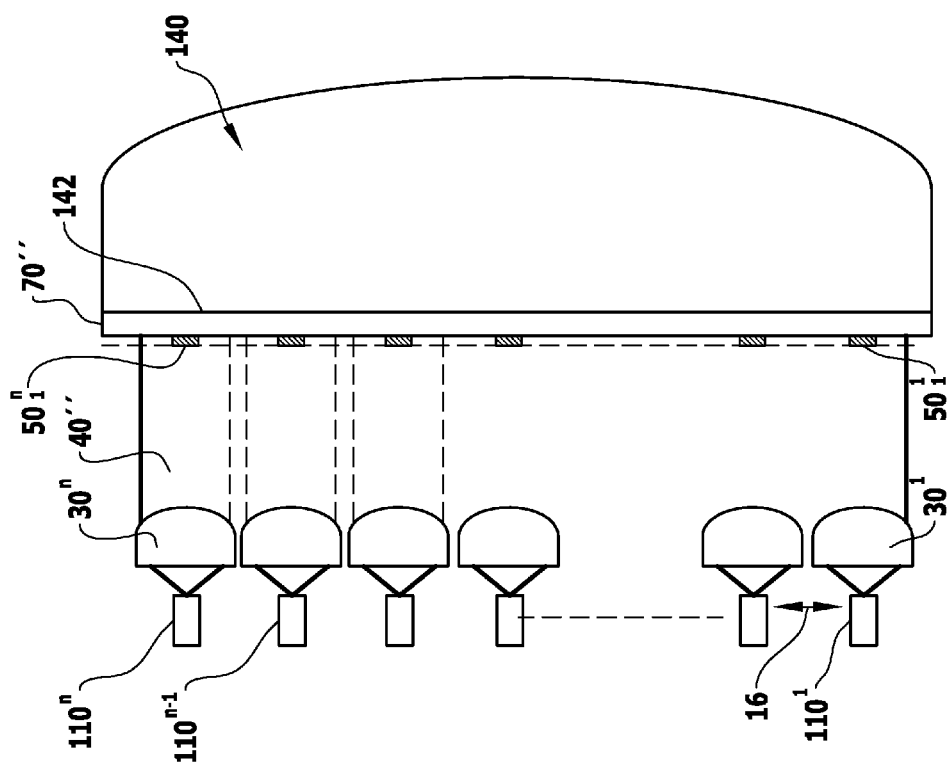
FIG. 26 shows a partial section, similar to FIG. 15, through an eleventh exemplary embodiment of a laser system according to the invention.

In an eleventh exemplary embodiment of a laser system according to the invention, illustrated in FIG. 26, similarly as for the fourth exemplary embodiment, a multiplicity of laser bars $110^1$ to $110^n$ is stacked one on top of the other in the direction of the second direction 16, and, for example, a separate collimating lens $30^1$ to $30^n$ is provided for each of the laser bars 110, so that the partially collimated regions 40 of the laser radiation fields are all partially collimated in the second direction 16, and impinge on a waveguide grating $50_1^{\ 1}$ to $50_n^{\ n}$, provided for each individual semiconductor laser 10 of the laser bars 110, which bars are situated, for example, on a shared substrate 70" which in turn is situated on a rear side 142 of a focusing lens 140 shared by the partially collimated regions 40" of the laser radiation fields 20, so that the substrate 70" is held by the lens 140.

Thus, in each of the laser bars 110, all individual semiconductor lasers $10_1$ to $10_n$ are individually externally stabilizable by the respective resonant waveguide grating $50_1^{\ x}$ to $50_n^{\ x}$, and there is no coupling of the partially collimated regions 40 with a semiconductor laser 10 situated to the side thereof, thereabove, or therebeneath.

It is thus possible to externally stabilize each individual semiconductor laser 10 at a selected wavelength.

For example, the semiconductor lasers 10 of a semiconductor laser bar 110 could be externally stabilized at the same wavelength, and the wavelength could be varied from the semiconductor laser bar $110^x$ to the semiconductor laser bar $110^{x+1}$ or $110^{x-1}$.

A particularly advantageous solution provides that at a different wavelength, each of the semiconductor lasers $10_x^{\ x}$ is externally stabilized by the corresponding resonant waveguide grating $50_x^{\ x}$ at a wavelength that is different from the wavelength of the other semiconductor lasers $10_{x+y}^{\ x+y}$.

The semiconductor lasers $10_1^{\ x}$ to $10_n^{\ x}$ of each of the semiconductor laser bars $110^x$ are preferably made of the same material, but in each case are externally stabilized at a different wavelength, and the various semiconductor bars 110 may be made of different materials, so that the semiconductor lasers 10 in these semiconductor laser bars 110 may be stabilized in different wavelength ranges.

The invention claimed is:

1. Laser system comprising:
   at least one externally stabilizable semiconductor laser, from a laser active zone of which a laser radiation field can be coupled out, and
   a feedback element, disposed externally in the laser radiation field, which couples out, from the laser radiation field, a feedback radiation field having a defined wavelength and bandwidth, and coupling back the same into the active laser zone for determining a wavelength and bandwidth of the laser radiation field,
   the feedback element being a resonant waveguide grating which reflects back a portion of the laser radiation field lying within an angular acceptance range,
   the feedback element being a resonant waveguide grating having multiple periodicity,
   the resonant waveguide grating has an angular acceptance range of greater than ±2°,
   the resonant waveguide grating being composed of at least three waveguide layers: a topmost waveguide layer having a high index of refraction, a waveguide layer thereebeneath having a low index of refraction, and a waveguide layer, situated opposite from the topmost waveguide layer, having a high index of refraction.

2. The laser system according to claim 1, wherein a resonant back-reflection of the waveguide grating is polarization-dependent.

3. The laser system according to claim 1, wherein the resonant waveguide grating has waveguide layers applied to a substrate.

4. The laser system according to claim 3, wherein a grating structure is specified by a substrate surface which carries the waveguide layers.

5. The laser system according to claim 3, wherein a grating structure is specified by a topmost waveguide layer facing away from the substrate.

6. The laser system according to claim 1, wherein the resonant waveguide grating partially back-reflects an incident laser radiation field, offset in a wavelength propagation direction.

7. The laser system according to claim 1, wherein the resonant waveguide grating is situated on a heat sink that is transparent to the laser radiation field.

8. The laser system according to claim 1, wherein the resonant waveguide grating is situated in an at least partially collimated region of the laser radiation field.

9. The laser system according to claim 1, wherein the resonant waveguide grating is situated in a focused portion of the laser radiation field.

10. The laser system according to claim 1, wherein the resonant waveguide grating is situated in a subarea of a radiation cross-section of the laser radiation field.

11. The laser system according to claim 1, wherein the resonant waveguide grating extends in a strip-like manner in a radiation cross-section of the laser radiation field.

12. The laser system according to claim 10, wherein the resonant waveguide grating extends in a strip-like manner within at least two adjacently situated radiation cross-sections of adjacently situated laser radiation fields.

13. The laser system according to claim 1, wherein the resonant waveguide grating has grating patches distributed within a particular radiation cross-section.

14. The laser system according to claim 1, wherein the at least one externally stabilizable semiconductor laser comprises a plurality of externally stabilizable semiconductor lasers which are situated one after the other in a row direction.

15. The laser system according to claim 1, wherein the at least one externally stabilizable semiconductor laser comprises a plurality of externally stabilizable semiconductor lasers situated one after the other in a row direction in a semiconductor laser bar.

16. The laser system according to claim 15, wherein the laser radiation fields have low divergence in a first direction parallel to the row direction.

17. The laser system according to claim 15, wherein the laser radiation fields have high divergence in a second direction extending transversely with respect to the row direction.

18. The laser system according to claim 15, wherein the semiconductor lasers situated one after the other in the row direction generate laser radiation fields which have radiation cross-sections situated one after the other in a direction extending parallel to the row direction.

19. The laser system according to claim 18, wherein a strip-shaped resonant waveguide grating extends parallel to the row direction within at least two radiation cross-sections.

20. The laser system according to claim 1, wherein the resonant waveguide grating is arranged on a substrate that is transparent to the laser radiation field.

* * * * *

UNITED STATES PATENT AND TRADEMARK OFFICE
CERTIFICATE OF CORRECTION

| | |
|---|---|
| PATENT NO. | : 8,687,667 B2 |
| APPLICATION NO. | : 13/624129 |
| DATED | : April 1, 2014 |
| INVENTOR(S) | : Abdou Ahmed et al. |

It is certified that error appears in the above-identified patent and that said Letters Patent is hereby corrected as shown below:

Title Page, Item (12) and Item (72) are corrected to read:

(12) United States Patent
  Abdou Ahmed et al.

(72) Inventors: Marwan Abdou Ahmed, Stuttgart (DE);
  Andreas Voss, Stuttgart (DE)

Signed and Sealed this
Eighth Day of July, 2014

Michelle K. Lee
*Deputy Director of the United States Patent and Trademark Office*